(12) United States Patent  
Terai et al.

(10) Patent No.: US 9,118,009 B2  
(45) Date of Patent: Aug. 25, 2015

(54) METHOD OF FABRICATING A VARIABLE REISTANCE MEMORY DEVICE

(71) Applicant: Samsung Electronics Co., Ltd., Suwon-si (KR)

(72) Inventors: Masayuki Terai, Suwon-si (KR); In-Gyu Baek, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/318,767

(22) Filed: Jun. 30, 2014

(65) Prior Publication Data

US 2015/0104921 A1 Apr. 16, 2015

(30) Foreign Application Priority Data

Oct. 11, 2013 (KR) ........................ 10-2013-0121486

(51) Int. Cl.
*H01L 45/00* (2006.01)
*H01L 27/24* (2006.01)

(52) U.S. Cl.
CPC ............ *H01L 45/16* (2013.01); *H01L 27/2409* (2013.01); *H01L 45/04* (2013.01); *H01L 45/1253* (2013.01); *H01L 45/1266* (2013.01); *H01L 45/146* (2013.01); *H01L 45/1675* (2013.01)

(58) Field of Classification Search
None
See application file for complete search history.

(56) References Cited

U.S. PATENT DOCUMENTS

| 4,228,525 | A | * | 10/1980 | Kawarada et al. | 365/174 |
| 4,231,109 | A | * | 10/1980 | Ono et al. | 365/181 |
| 5,838,609 | A | * | 11/1998 | Kuriyama | 365/159 |
| 7,233,526 | B2 | * | 6/2007 | Umezawa | 365/185.27 |
| 7,405,960 | B2 | | 7/2008 | Cho et al. | |
| 7,767,499 | B2 | | 8/2010 | Herner | |
| 8,259,489 | B2 | | 9/2012 | Nagashima et al. | |
| 8,477,525 | B2 | | 7/2013 | Ito | |

FOREIGN PATENT DOCUMENTS

JP 2011-198407 10/2011
KR 10 0827706 B1 4/2008

* cited by examiner

*Primary Examiner* — Scott B Geyer
(74) *Attorney, Agent, or Firm* — Myers Bigel Sibley & Sajovec, P.A.

(57) ABSTRACT

A method of fabricating a memory device includes defining a cell region on a substrate and defining a dummy region around the cell region, forming bit lines on a top surface of the substrate, the bit lines extending in one direction, forming cell vertical structures on top surfaces of the bit lines corresponding to the cell region, each cell vertical structure including a cell diode and a variable resistive element, forming dummy vertical structures on top surfaces of the bit lines corresponding to the dummy region, each dummy vertical structure including a dummy diode and a variable resistive element, and forming word lines in contact with top surfaces of the cell vertical structures and dummy vertical structures, the word lines intersecting the bit lines at right angles. The cell diode includes a first impurity pattern and a second impurity pattern, the dummy diode includes a first lightly doped impurity pattern and a second impurity pattern, and the variable resistive element includes a first electrode, a variable resistor, and a second electrode.

20 Claims, 37 Drawing Sheets

METHOD OF FABRICATING A VARIABLE REISTANCE MEMORY DEVICE

CROSS-REFERENCE TO RELATED APPLICATION

This application claims priority under 35 U.S.C. §119 to Korean Patent Application No. 10-2013-0121486, filed on Oct. 11, 2013, the disclosure of which is hereby incorporated herein by reference in its entirety.

BACKGROUND

Embodiments of the inventive concept provide a method of fabricating a memory device, and more particularly, provide a method of fabricating a nonvolatile variable resistive memory device.

A variable resistive memory device may include a cell region in which data may be stored and read therefrom and a dummy region disposed around the cell region. Both the cell region and the dummy region may include memory cells, each memory cell including a diode and a variable resistor. The memory cells included in the dummy region may operate independently of the memory cells in the cell region. However, leakage currents that may occur in the memory cells in the dummy region may affect operations of the memory cells of the cell region. Accordingly, various techniques for preventing the memory cells of the cell region from being affected by the memory cells of the dummy region have been proposed.

SUMMARY

Embodiments of the inventive concept provide a method of fabricating a memory device, which may reduce leakage currents that may arise in, for example, a diode of a memory cell of a dummy region from affecting operations of a memory cell of a cell region.

Embodiments of the inventive concept also provide a method of fabricating a memory device, in which impurity layers constituting a diode of a dummy region include at least one lightly doped impurity layer.

The technical objectives of the inventive disclosure are not limited to the above disclosure; other objectives may become apparent to those of ordinary skill in the art based on the following descriptions.

In accordance with an aspect of the inventive concept, a method of fabricating a memory device includes defining a cell region on a substrate and defining a dummy region on the substrate that surrounds the cell region, forming bit lines on a top surface of the substrate, the bit lines extending in onedirection, forming cell vertical structures on top surfaces of the bit lines corresponding to the cell region, each cell vertical structure including a cell diode and a variable resistive element, forming dummy vertical structures on top surfaces of the bit lines corresponding to the dummy region, each dummy vertical structure including a dummy diode and a variable resistive element, and forming word lines in contact with top surfaces of the cell vertical structures and dummy vertical structures, the word lines intersecting the bit lines at right angles. The cell diode includes a first impurity pattern that includes first conductivity type impurities and a second impurity pattern that includes second conductivity type impurities that are of an opposite conductivity type from the first conductivity type impurities, the dummy diode includes a first impurity pattern having a first concentration of the first conductivity type impurities and a second impurity pattern that includes a second concentration of the second conductivity type impurities, the first concentration being less than the second concentration, and the variable resistive element includes a first electrode, a variable resistor, and a second electrode.

The formation of the bit lines and the word lines may include forming cell bit lines throughout the cell region and the dummy region, forming dummy bit lines in the dummy region, the dummy bit lines being parallel to the cell bit lines, forming cell word lines throughout the cell region and the dummy region, the cell word lines intersecting the cell bit lines at right angles, and forming dummy word lines in the dummy region parallel to the cell word lines.

The formation of the bit lines, the word lines, the cell vertical structures, and the dummy vertical structures may include sequentially forming a first metal layer, a first impurity layer, and a second impurity layer on the substrate, implanting second conductivity type impurities into the first impurity layer of the dummy region, sequentially forming a first electrode layer, a variable resistive layer, and a second electrode layer on a top surface of the second impurity layer, and patterning the first electrode layer, the variable resistive layer, and the second electrode layer, forming cell bit lines, dummy bit lines, preliminary cell vertical structures, and preliminary dummy vertical structures, the cell bit lines and the dummy bit lines extending on the substrate in one direction, the preliminary cell vertical structures being stacked on top surfaces of the cell bit lines, and the preliminary dummy vertical structures being stacked on the top surfaces of the dummy bit lines, forming a second metal layer on top surfaces of the preliminary cell vertical structures and preliminary dummy vertical structures, patterning the second metal layer, the preliminary cell vertical structures, and the preliminary dummy vertical structures, and forming word lines intersecting the bit lines at right angles, forming island-shaped cell vertical structures in the cell region, and forming island-shaped dummy vertical structures in the dummy region.

The implantation of the second conductivity type impurities into the first impurity layer formed in the dummy region may include forming a first mask pattern on a top surface of the second impurity layer corresponding to the cell region, and implanting the second conductivity type impurities into the first impurity layer corresponding to the dummy region using the first mask pattern as an ion implantation stop layer to form a first lightly doped impurity layer containing a low-concentration of first conductivity type impurities. The first conductivity type impurities may be n-type impurities, and the second conductivity type impurities may be p-type impurities. The first impurity pattern of the cell diode may include a third concentration of the first conductivity type impurities that exceeds the first concentration.

The formation of the bit lines, the preliminary cell vertical structures, and the preliminary dummy vertical structures may include forming second mask patterns on a top surface of the second electrode layer, the second mask patterns parallel to one side of the substrate and spaced apart from one another, and etching the first metal layer, the first impurity layer, the second impurity layer, the first electrode layer, the variable resistive layer, and the second electrode layer using the second mask patterns as an etch mask to form the cell bit lines, the preliminary cell vertical structures on the top surfaces of the cell bit lines, the dummy bit lines, and the preliminary dummy vertical structures on the top surfaces of the dummy bit lines.

The formation of the word lines, the cell vertical structures, and the dummy vertical structures may include forming third mask patterns over the second metal layer to extend in a direction intersecting the bit lines at right angles, patterning the preliminary cell vertical structures and the preliminary dummy vertical structures using the third mask patterns as an etch mask to form word lines at right angles to the bit lines, the word lines having intersection regions intersecting the bit lines in the cell region and the dummy region, and forming island-shaped cell vertical structures in the intersection regions of the cell region and forming dummy vertical structures in the intersection regions of the dummy region.

In accordance with another aspect of the inventive concept, a method of fabricating a memory device includes defining a cell region in a substrate and defining a dummy region around the cell region, forming a plurality of parallel, spaced-apart bit lines extending across the cell region and the dummy region, forming preliminary vertical structures having the same shape as the bit lines on top surfaces of the bit lines, each preliminary vertical structure including a first preliminary impurity pattern, a second preliminary impurity pattern, and a preliminary variable resistive element, implanting second conductivity type impurities into the first preliminary impurity pattern formed in the dummy region, forming word lines at right angles to the bit lines, the word lines having intersection regions intersecting the bit lines in the cell region and the dummy region, patterning the preliminary vertical structures to form island-shaped vertical structures in the respective intersection regions, each island-shaped vertical structure including a first impurity pattern, a second impurity pattern, and a variable resistive element, and implanting second conductivity type impurities into first impurity patterns of the vertical structures disposed in the dummy region parallel to the word lines.

The formation of the bit line and the preliminary vertical structures may include sequentially forming a first metal layer, a first impurity layer, a second impurity layer, a first electrode layer, a variable resistive layer, and a second electrode layer on the substrate, forming first mask patterns over the second electrode layer, the first mask patterns spaced apart from one another and parallel to one another, and performing a patterning process using the first mask patterns as an etch mask to form the preliminary vertical structures under the second mask patterns, each preliminary vertical structure including a bit line, a first preliminary impurity pattern, a second preliminary impurity pattern, a first preliminary electrode, a preliminary variable resistor, and a second preliminary electrode. The preliminary variable resistive element may include the first preliminary electrode, the preliminary variable resistor, and the second preliminary electrode.

The implantation of the second conductivity type impurities into each of the first preliminary impurity pattern and the first impurity pattern may include implanting the second conductivity type impurities into the first preliminary impurity pattern and the first impurity pattern at a predetermined implantation angle. The first preliminary impurity pattern and the first impurity pattern into which the second conductivity type impurities are implanted may contain a low-concentration of n-type impurities, and the second conductivity type impurities may be p-type impurities.

The dummy region may include first regions disposed parallel to the bit lines and opposite one another and second regions disposed parallel to the word lines and opposite one another. One bit line may be formed in each of the first regions, and one word line may be formed in each of the second regions.

Specific particulars of other embodiments are included in detailed descriptions and drawings.

Pursuant to further embodiments, methods of forming a memory device are provided in which a plurality of memory cells are formed in a cell region of the memory device and a plurality of dummy memory cells are formed in a dummy region of the memory device. A plurality of cell diodes are formed that are electrically connected in series with respective ones of the memory cells, and a plurality of dummy diodes are formed that are electrically connected in series with respective ones of the dummy memory cells. The cell diodes and the dummy diodes each include a first impurity pattern having impurities of a first conductivity type and a second impurity pattern having impurities of a second conductivity type that is opposite the first conductivity type, and the second impurity pattern in the dummy diodes is more heavily doped than is the first impurity pattern in the dummy diodes.

The first impurity pattern in the cell diodes may be a heavily-doped impurity pattern and the first impurity pattern in the dummy diodes may be a lightly-doped impurity pattern.

Each memory cell may include a variable resistor, and p-n junctions of the dummy diodes may have a larger difference in impurity concentration than do p-n junctions of the cell diodes.

The dummy diodes may be formed by forming the first impurity pattern having impurities of the first conductivity type and forming the second impurity pattern having impurities of the second conductivity type, and then implanting impurities of the second conductivity type into the first impurity pattern to reduce concentration of impurities of the first conductivity type in the first impurity pattern.

The dummy region may surround the cell region.

BRIEF DESCRIPTION OF THE DRAWINGS

The foregoing and other features and advantages of the inventive concepts will be apparent from the more particular description of embodiments of the inventive concepts, as illustrated in the accompanying drawings The drawings are not necessarily to scale, emphasis instead being placed upon illustrating the principles of the inventive concepts. In the drawings:

FIGS. 4A through 10A and 4B through 10B are sectional views taken along lines I-I' and II-II' of FIG. 1 illustrating processes of a method of fabricating a memory device according to embodiments of the inventive concept;

FIGS. 4C through 10C are perspective views corresponding to the plan view of FIG. 1, which illustrate processes of a method of fabricating the memory device according to embodiments of the inventive concept;

FIGS. 11A through 18A and FIGS. 11B through 18B are sectional views taken along lines III-III' and IV-IV' of FIG. 1 illustrating processes of a method of fabricating a memory device according to further embodiments of the inventive concept;

FIGS. 11C through 18C are perspective views corresponding to the plan view of FIG. 1, which illustrate processes of a method of fabricating a memory device according to further embodiments of the inventive concept;

DETAILED DESCRIPTION

Figure 1:
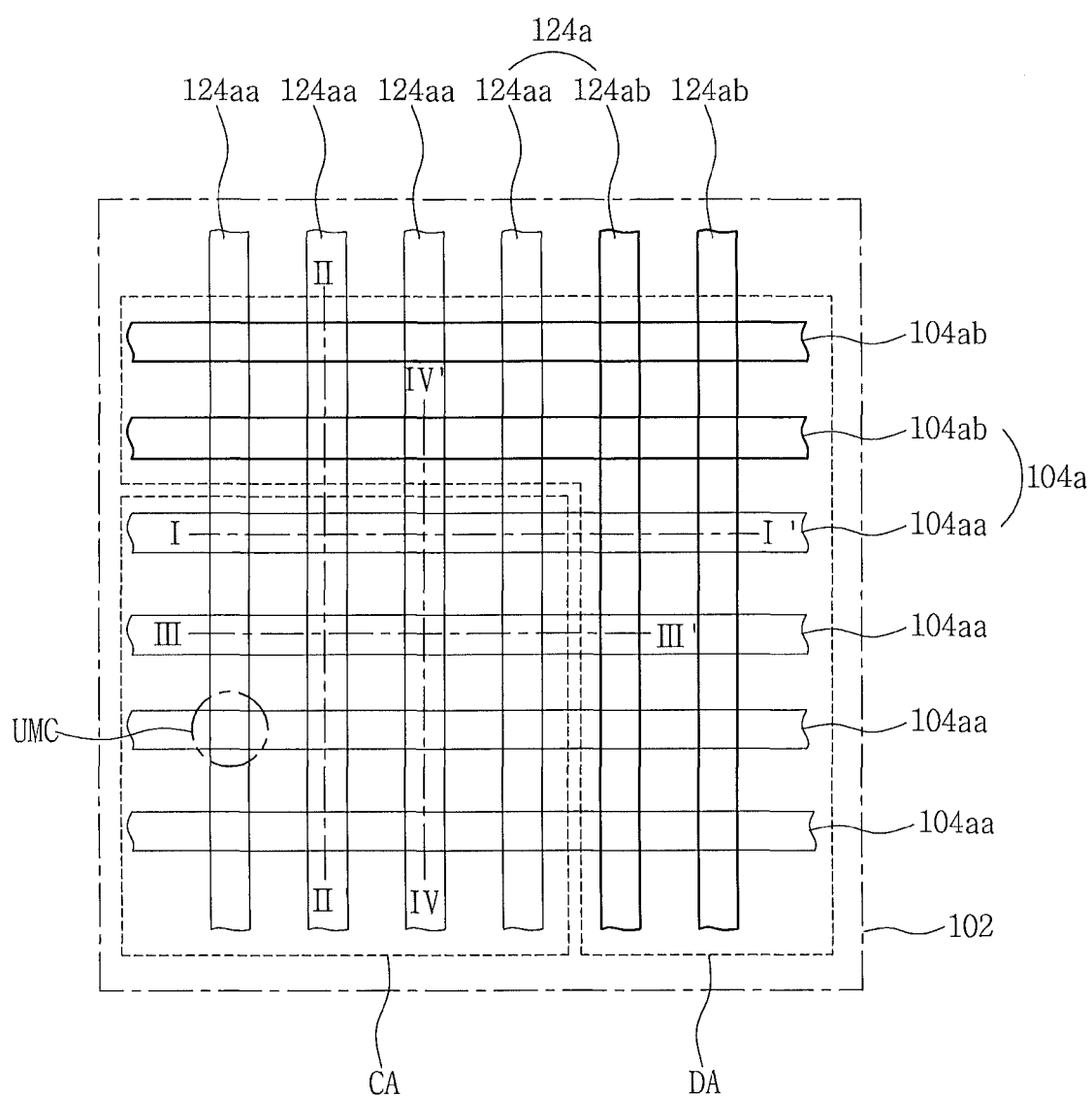
FIG. 1 is a schematic plan view illustrating portions of cell and dummy regions of a memory device according to embodiments of the inventive concept.

The inventive concept is described more fully hereinafter with reference to the accompanying drawings, in which embodiments of the inventive concept are shown. This inventive concept may, however, be embodied in many different forms and should not be construed as limited to the embodiments set forth herein. Rather, these embodiments are provided so that this disclosure will be thorough and complete, and will fully convey the scope of the inventive concept to those skilled in the art.

The terminology used herein to describe embodiments of the inventive concept is not intended to limit the scope of the inventive concept. The articles "a," "an," and "the" are singular in that they have a single referent, however the use of the singular form in the present document should not preclude the presence of more than one referent. In other words, elements of the inventive concept referred to in the singular may number one or more, unless the context clearly indicates otherwise. It will be further understood that the terms "comprises," "comprising," "includes," and/or "including," when used herein, specify the presence of stated features, items, steps, operations, elements, and/or components, but do not preclude the presence or addition of one or more other features, items, steps, operations, elements, components, and/or groups thereof.

It will be understood that when an element or layer is referred to as being "on", "connected to" or "coupled to" another element or layer, it can be directly on, connected or coupled to other element or layer or intervening elements or layers may be present. In contrast, when an element is referred to as being "directly on," "directly connected to" or "directly coupled to" another element or layer, there are no intervening elements or layers present. As used herein, the term "and/or" includes any and all combinations of one or more of the associated listed items.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Embodiments of the inventive concept are described herein with reference to cross-section and/or plan illustrations that are schematic illustrations of idealized embodiments of the inventive concept. As such, variations from the shapes of the illustrations as a result, for example, of manufacturing techniques and/or tolerances, are to be expected. Thus, embodiments of the inventive concept should not be construed as limited to the particular shapes of regions illustrated herein but are to include deviations in shapes that result, for example, from manufacturing. For example, an etched region illustrated as a rectangle will, typically, have rounded or curved features. Thus, the regions illustrated in the figures are schematic in nature and their shapes are not intended to illustrate the precise shape of a region of a device and are not intended to limit the scope of the inventive concept.

Like numbers refer to like elements throughout. Thus, the same or similar numbers may be described with reference to other drawings even if they are neither mentioned nor described in the corresponding drawing.

Hereinafter, a memory device according to embodiments of the inventive concept and a method of fabricating the memory device will be described with reference to the appended drawings.

Figure 2A:
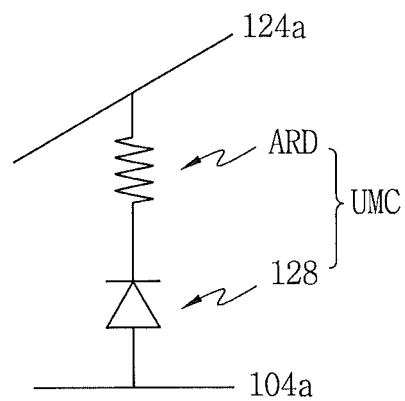
FIGS. 2A and 2B are equivalent circuit diagrams of a memory cell of the memory device shown in FIG. 1.
Figure 2B:
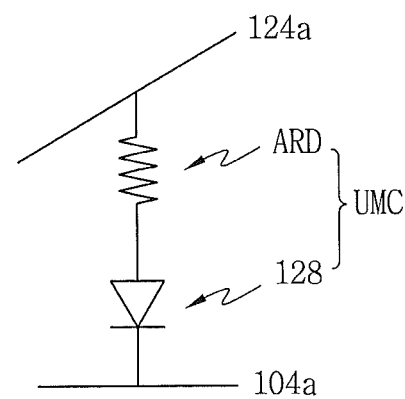
Figure 2C:
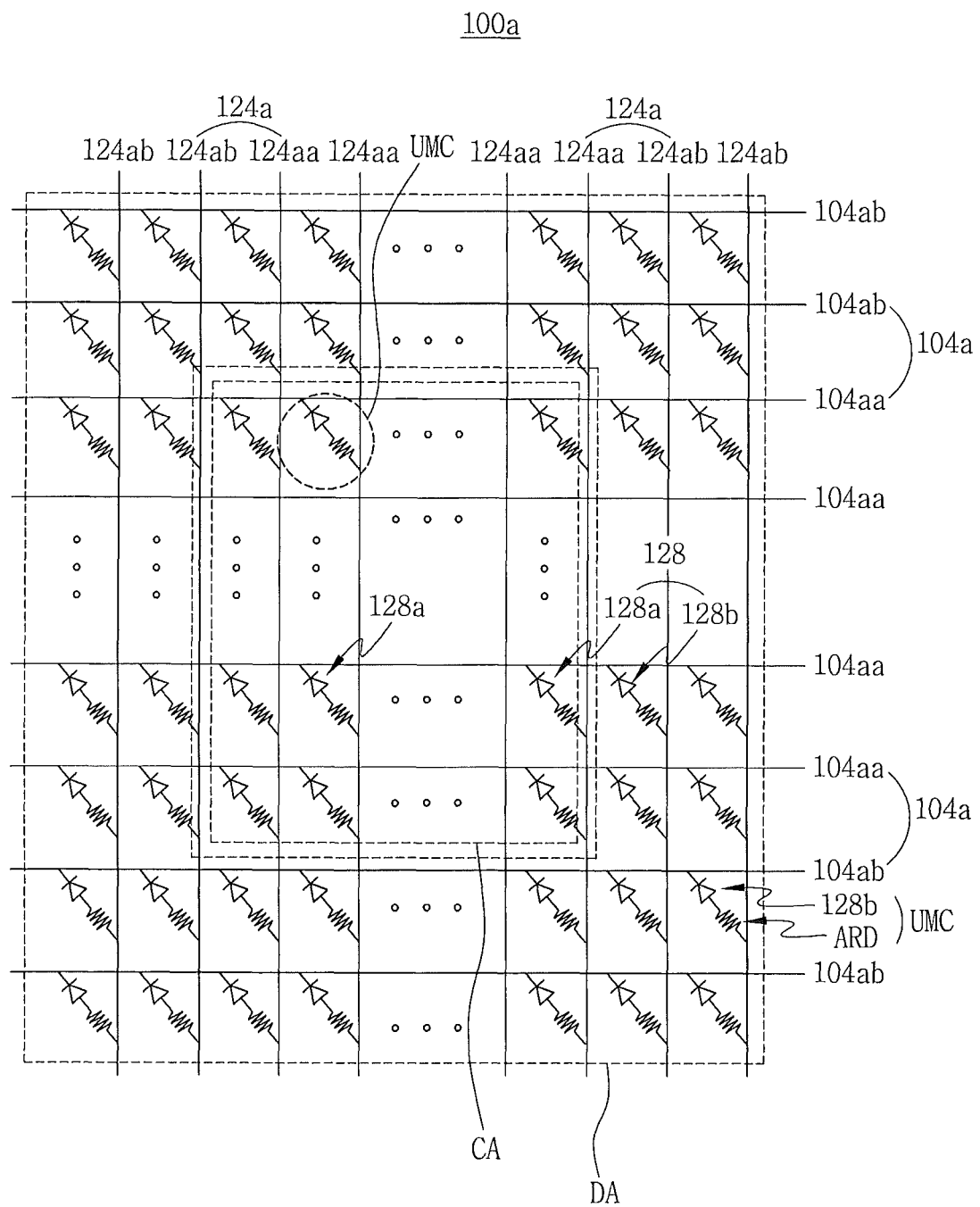
FIG. 2C is an equivalent circuit diagram of the memory device shown in FIG. 1.

FIG. 1 is a schematic plan view of portions of cell and dummy regions of a memory device according to embodiments of the inventive concept. FIGS. 2A and 2B are equivalent circuit diagrams of a memory cell of the memory device shown in FIG. 1. FIG. 2C is an equivalent circuit diagram of the memory device shown in FIG. 1. It will be appreciated that FIG. 2C illustrates the entire memory cell region of the memory device while FIG. 1 only illustrates a portion of the memory cell region.

Referring to FIGS. 1, 2A, 2B, and 2C, a memory device 100a according to embodiments of the inventive concept may include a substrate 102, a buffer layer 103, bit lines 104a, and memory cells UMC.

The substrate 102 may include a cell region CA and a dummy region DA. The dummy region DA may be defined around the cell region CA. The substrate 102 may comprise, for example, a bulk silicon wafer, a silicon on insulator (SOI) wafer, or a compound wafer such as a silicon germanium (SiGe) wafer or a silicon carbide (SiC) wafer.

The buffer layer 103 (not shown in FIG. 1) may be formed between the substrate 102 and the bit lines 104a. The buffer layer 103 may include silicon oxide.

The bit lines 104a may intersect the word lines 124a at right angles from a top view, as shown in FIG. 1.

The bit lines 104a may include cell bit lines 104aa and dummy bit lines 104ab. The word lines 124a may include cell word lines 124aa and dummy word lines 124ab.

The cell bit lines 104aa and the cell word lines 124a may be disposed in both the dummy region DA and the cell region CA. The dummy bit lines 104ab and the dummy word lines 124ab may be disposed entirely in the dummy region DA.

Memory cells UMC may be formed at each of regions in which the bit lines 104a intersect the word lines 124a.

As shown in FIGS. 2A and 2B, each memory cell UMC may include a variable resistive element ARD and a diode 128, which are connected in series.

Referring to FIG. 2C, the diode 128 may be a cell diode 128a that is disposed in the cell region CA or a dummy diode 128b that is disposed in the dummy region DA. The diode 128 may comprise, for example, a p-n junction diode, a p-i-n diode, or a Schottky diode. For example, the diode 128 according to a first embodiment of the inventive concept may include a p-n junction diode. The variable resistive element ARD may include a metal/insulator/silicon (MIS) or a metal/insulator/metal (MIM) structure. For example, a variable resistive element ARD according to the first embodiment of the inventive concept may include an MIM structure.

The variable resistive element ARD may be connected in series to the word line 124a and one terminal of the diode 128, and the other terminal of the diode 128 may be connected to the bit line 104a.

For example, as shown in FIG. 2A, an anode electrode of the diode 128 may be connected to the bit line 104a, a cathode electrode thereof may be connected to a terminal of a first electrode of the variable resistive element ARD, and a terminal of a second electrode of the variable resistive element ARD may be connected to the word line 124a.

In another example, as shown in FIG. 2B, the cathode electrode of the diode 128 may be connected to the bit line 104a, and the anode electrode thereof may be connected to the terminal of the first electrode of the variable resistive element ARD, and the terminal of the second electrode of the variable resistive element ARD may be connected to the word line 124a.

The memory device having the above-described construction may be a nonvolatile memory device. For example, the variable resistive element ARD may be a data storage device. Specifically, the memory device may perform memory operations using reversible characteristics of the variable resistive element ARD relative to the magnitudes of current and voltage applied to the memory cell UMC through the bit line 104a or the word line 124a.

For example, referring to FIG. 2A, when the bit line 104a is at a high level and the word line 124a is at a low level, a specific memory cell UMC may be selected. When the bit line 104a rises to the high level, the diode 128a is in a forward bias state in which current flows. That is, a current path from the bit line 104a to the word line 124a may be formed.

In this case, the amount of the current may depend on the variable resistance of the variable resistive element ARD that is connected in series to the diode 128. Accordingly, the current corresponding to the variable resistance may be sensed to read data. For example, an erased resistance state may correspond to a first range of current levels that are treated as indicating that data "1" was stored in the memory cell, and a programmed resistance state may correspond to a second range of current levels that are treated as indicating that data "0" was stored in the memory cell.

In FIG. 2B, when the word line 124a is at a high level and the bit line 104a is at a low level, a specific memory cell UMC may be selected. When the bit line 104a drops to the low level the diode 128 is in a forward bias state in which current flows. That is, a current path from the word line 124a to the bit line 104a may be formed. Once again, the amount of the current will depend on the variable resistance of the variable resistive element ARD that is connected in series to the diode 128. Accordingly, the current corresponding to the variable resistance may be sensed to read data. For example, an erased resistance state may correspond to a first range of current levels that are treated as indicating that data "1" was stored in the memory cell, and a programmed resistance state may correspond to a second range of current levels that are treated as indicating that data "0" was stored in the memory cell.

Referring to FIGS. 1 and 2C, the dummy region DA of the memory device 100a may be provided to precisely pattern the cell region CA. Specifically, photolithography and etching processes may be performed to pattern the cell region CA. The photolithography and etching processes may be performed to transfer a specific pattern to the substrate 102. The photolithography and etching processes may include an exposure process using a mask.

During the exposure process, light may be scattered in an outer portion of the cell region CA corresponding to an end tip of the mask. Due to the scattering of light, patterns formed in the outer portion of the cell region CA may not be precisely transferred.

To solve this problem, the dummy region DA may be formed in the outer portion of the cell region CA. By forming the dummy region DA, scattering of light within the cell region CA may be reduced or eliminated so that more precise patterns can be transferred within the cell region CA.

In order to enable smooth operations of the memory device 100a, it may be desirable to electrically isolate the dummy region DA from the cell region CA. In particular, it may be desirable to prevent leakage currents from the dummy diodes 128b that are formed in the dummy region DA from adversely affecting the cell region CA of the device. This may be done, for example, by reducing the amount of the leakage currents from the dummy diodes 128b to levels that are sufficiently low that they do not adversely affect operation of the devices in the dell region CA.

In example embodiments, the leakage currents from the dummy diodes 128b may be reduced by reducing the impurity concentration of a p-type impurity layer or of an n-type impurity layer of each of the dummy diodes 128b.

This process will now be described with reference to FIGS. 3A through 3C.

Figure 3A:
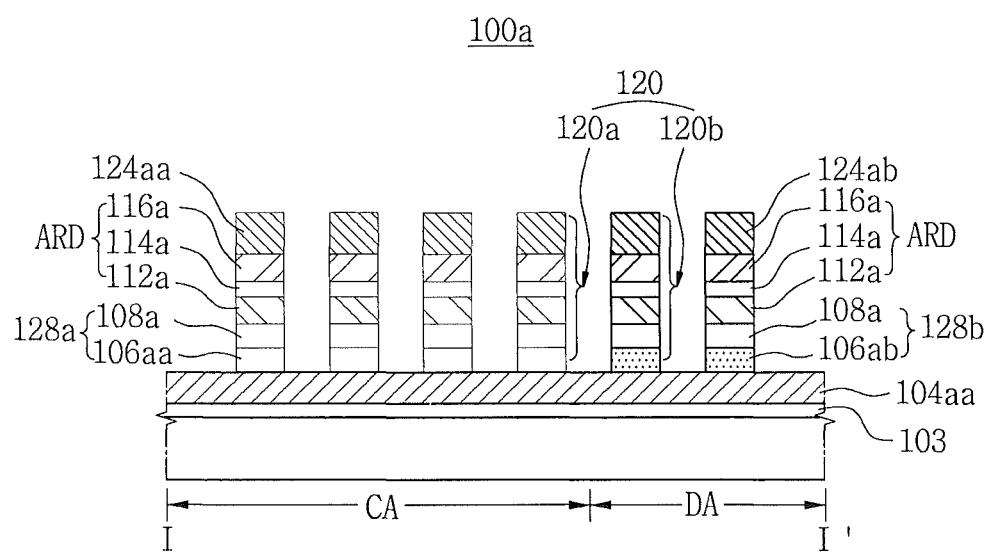
FIGS. 3A and 3B are vertical sectional views taken along lines I-I' and II-II' of FIG. 1.
Figure 3B:
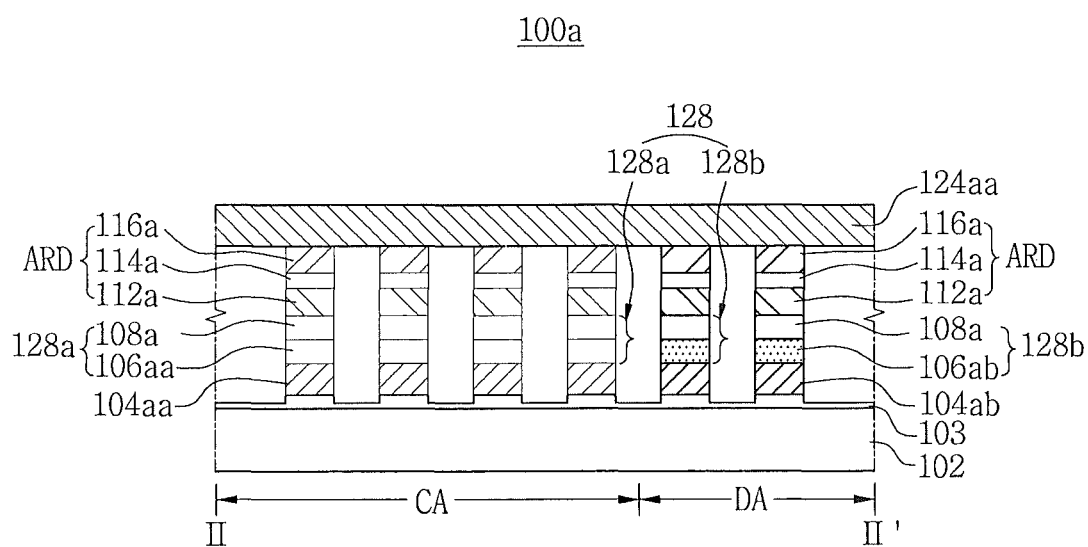
Figure 3C:
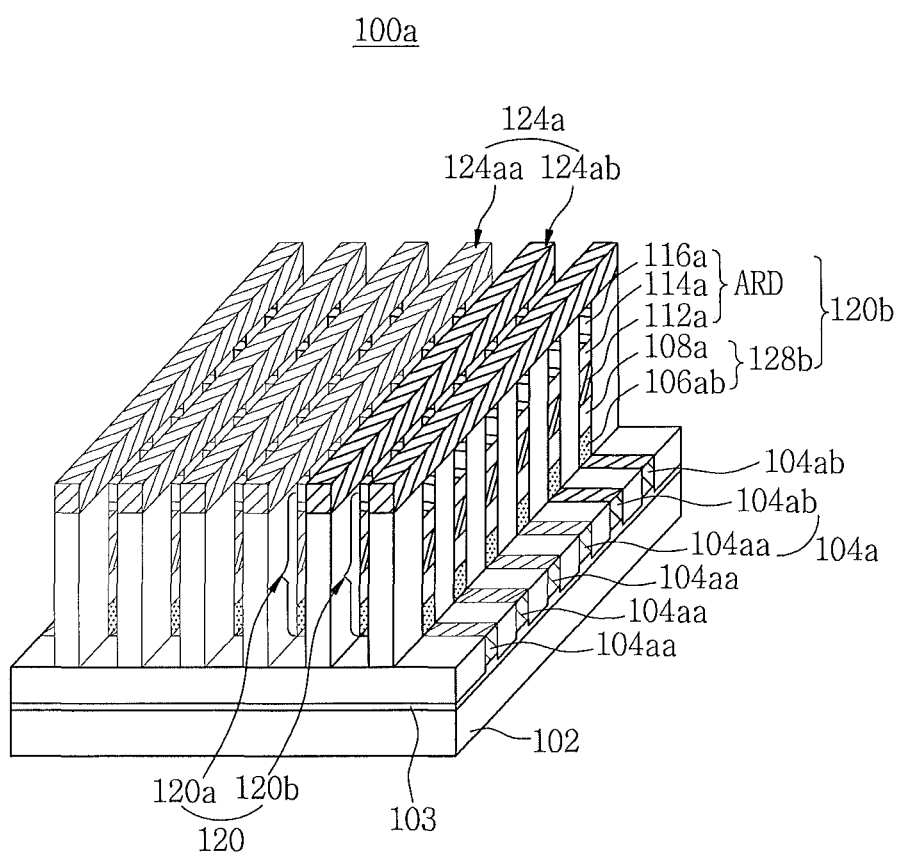
FIG. 3C is a perspective view corresponding to the plan view of FIG. 1.
Figure 4A:
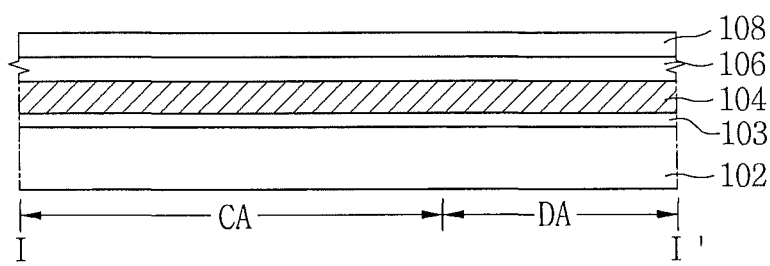
Figure 4B:
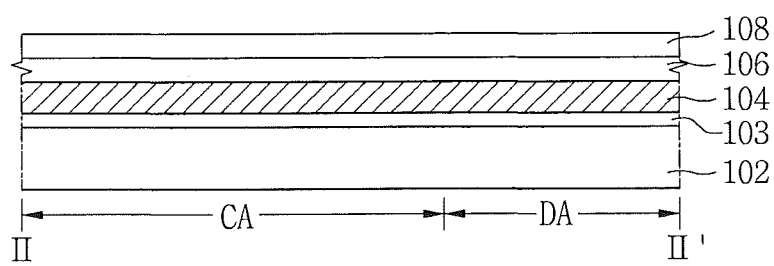
Figure 4C:
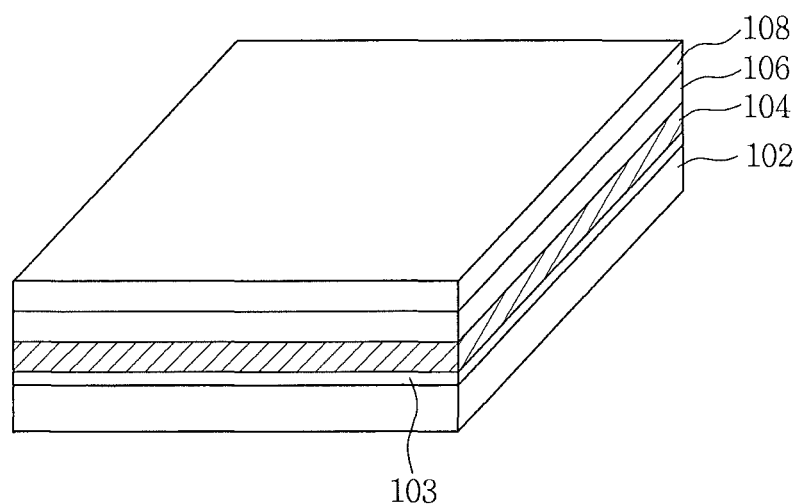

FIGS. 3A and 3B are vertical sectional views taken along lines I-I' and II-II' of FIG. 1, and FIG. 3C is a perspective view corresponding to the plan view of FIG. 1.

Referring to FIGS. 3A through 3C, the memory device 100a according to embodiments of the inventive concept may include a substrate 102, a buffer layer 103, bit lines 104a, vertical structures 120, and word lines 124a.

The substrate 102 may include a cell region CA and a dummy region DA that is disposed around the cell region CA. The substrate 102 may be, for example, a Si substrate or a SiGe substrate.

The buffer layer 103 may be formed on the entire surface of the substrate 102 and may be disposed between the bit lines 104a and the substrate 102.

The bit lines 104a may include cell bit lines 104aa and dummy bit lines 104ab. The word lines 124a may include cell word lines 124aa and dummy word lines 124ab. The dummy bit lines 104ab may intersect the dummy word lines 124ab.

The bit lines 104a and the word lines 124a may include tungsten (W), aluminum (Al), titanium nitride (TiN), or tungsten nitride (WN).

The vertical structures 120 may be formed in respective regions in which the bit lines 104a intersect the word lines 124a. The vertical structures 120 may include cell vertical structures 120a formed in the cell region CA and dummy vertical structures 120b formed in the dummy region DA.

Each of the vertical structures 120 may include a diode 128 and a variable resistive element ARD, which are electrically connected in series.

The variable resistive element ARD may include a first electrode 112a, a variable resistor 114a, and a second electrode 116a.

Each of the first electrode 112a and the second electrode 116a may include, for example, platinum (Pt), ruthenium (Ru), ruthenium oxide (RuOx), iridium (Ir), iridium oxide (IrOx), titanium nitride (TiN), tungsten (W), tantalum (Ta), or tantalum nitride (TaN). The insulating layer pattern may include hafnium oxide (HfOx), titanium oxide (TiOx), nickel oxide (NiOx), zirconium oxide (ZrOx), aluminum oxide (AlOx), silicon oxide (SiOx), niobium oxide (NbOx), or tungsten oxide (WOx).

In another example, the second electrode 116a may include polysilicon doped with impurities (doped poly-Si).

The diodes 128 may include cell diodes 128a that are included in the cell vertical structure 120a and dummy diodes 128b that are included in the dummy vertical structures 120b.

Each of the cell diodes 128a may include an n-type impurity pattern 106aa containing a high-concentration of n-type impurities and a p-type impurity pattern 108a containing a high-concentration of p-type impurities. Each of the dummy diodes 128b may include a lightly doped n-type impurity pattern 106ab containing a low-concentration of n-type impurities and a p-type impurity pattern 108a containing a high-concentration of p-type impurities.

The n-type impurities may be a Group-V element, such as phosphorus (P), arsenic (As), or antimony (Sb), and the p-type impurities may be a Group-III element, such as boron (B), indium (In), or gallium (Ga).

In the above-described construction, the lightly doped n-type impurity pattern 106ab of the dummy diode 128b may have a lower impurity concentration than the n-type impurity pattern 106aa of each of the cell diodes 128a. The lightly doped n-type impurity pattern 106ab of the dummy diode 128b may also have a lower impurity concentration than the p-type impurity pattern 108a of the dummy diode 128b. Thus, a p-n junction diode including the lightly doped n-type impurity pattern 106ab and the heavily doped p-type impurity pattern 108a may have a reduced impurity concentration near the p-n junction of the diode 128b so that the intensity of an electric field of the p-n junction may be reduced. Accordingly, a leakage current may be reduced or eliminated.

Accordingly, the dummy vertical structures 120b that are formed in the dummy region DA may be electrically isolated from the cell vertical structures 120a that are formed in the cell region CA.

Hereinafter, a method of fabricating the memory device 100a according to embodiments of the inventive concept, which includes a process of forming the lightly-doped n-type impurity pattern 106ab of the dummy diode 128b, will be described with reference to the accompanying drawings.

FIGS. 4A through 10A and 4B through 10B are sectional views taken along lines I-I' and II-II' of FIG. 1 illustrating processes of a method of fabricating a memory device according to embodiments of the inventive concept.

FIGS. 4C through 10C are perspective views corresponding to the plan view of FIG. 1, which illustrate processes of a method of fabricating the memory device 100a according to embodiments of the inventive concept.

Referring to FIGS. 4A through 4C and FIG. 2C, the method of fabricating the memory device 100a may include sequentially forming a buffer layer 103, a first metal layer 104, an n-type impurity layer 106, and a p-type impurity layer 108 on the substrate 102.

The substrate 102 may include a cell region CA and a dummy region DA. The dummy region DA may be formed around the cell region CA. The substrate 102 may include a silicon substrate.

The buffer layer 103 may include, for example, silicon oxide. The buffer layer 103 may be formed by depositing silicon oxide on the substrate 102.

The first metal layer 104 may be formed on a top surface of the substrate 102. The first metal layer 104 may include, for example, tungsten, aluminum, titanium nitride, or tungsten nitride.

The formation of the n-type impurity layer 106 and the p-type impurity layer 108 may include doping a high-concentration of n-type impurities and a high-concentration of p-type impurities into an intrinsic amorphous silicon layer, respectively. The doping of the impurities may include, for example, an ion diffusion process or an ion implantation process.

The ion diffusion process may include diffusing a high-concentration of ions into an intrinsic amorphous silicon layer in-situ. The ion implantation process may include implanting plasma-type ions into the intrinsic amorphous silicon layer in a vacuum state.

For example, an ion doping process according to the inventive concept may include an ion implantation process.

The n-type impurities may be a Group-V element, such as phosphorus, arsenic, or antimony. The p-type impurities may be a Group-III element, such as boron, indium, or gallium.

In the above-described construction, referring back to FIG. 2A, the p-type impurity layer 108 may be formed on the n-type impurity layer 106.

Subsequently, the n-type impurity layer and the p-type impurity layer, which are doped with the impurities, may be annealed to form a poly-Si layer containing n-type impurities and a poly-Si layer containing p-type impurities, respectively.

In the above-described process, a thin metal silicide layer may be formed between the first metal layer 104 and the n-type impurity layer 106.

Referring to FIGS. 5A through 5C and FIG. 2C, the method of fabricating the memory device 100a may include forming a first mask pattern 110 on a top surface of the p-type impurity layer 108, and implanting impurities into a region of the device that is not covered by the first mask pattern 110.

The first mask pattern 110 may cover the cell region CA and expose the dummy region DA that is disposed around the cell region CA. The top surface of the p-type impurity layer 108 corresponding to the dummy region DA may be exposed around the first mask pattern 110. The first mask pattern 110 may be a photoresist (PR) pattern. The first mask pattern 110 may be an ion implantation stop layer. The first mask layer 110 may be removed after the ion implantation is completed.

The implantation of the impurities may include implanting p-type impurities into the n-type impurity layer 106 or implanting n-type impurities into the p-type impurity layer 108.

For example, the method of fabricating the memory device 100a according to the inventive concept may include implanting p-type impurities into the n-type impurity layer 106. In this case, the p-type impurities may be implanted through the p-type impurity layer 108 into the n-type impurity layer 106.

The n-type impurity concentration of the region of the n-type impurity layer 106 that is doped with the p-type impurities may be sharply reduced. Specifically, the n-type impurity layer 106 may originally (i.e., prior to implantation) contain a high-concentration of n-type impurities. When p-type impurities are implanted into the heavily doped n-type impurity layer 106, the implanted p-type impurities may compensate donors in the n-type impurity layer 106. Accordingly, the concentration of the n-type impurities contained in the n-type impurity layer 106 may be reduced. The above-described process may be applied likewise to a case in which n-type impurities are implanted into the p-type impurity layer 108. It will be appreciated that the impurity concentrations that are referenced herein refer to uncompensated impurities. Consequently, for example, implanting p-type impurities into a first layer that has a high concentration of n-type impurities acts to reduce the n-type impurity concentration of the first layer since the added p-type impurities will compensate some of the n-type impurities.

Figure 6A:
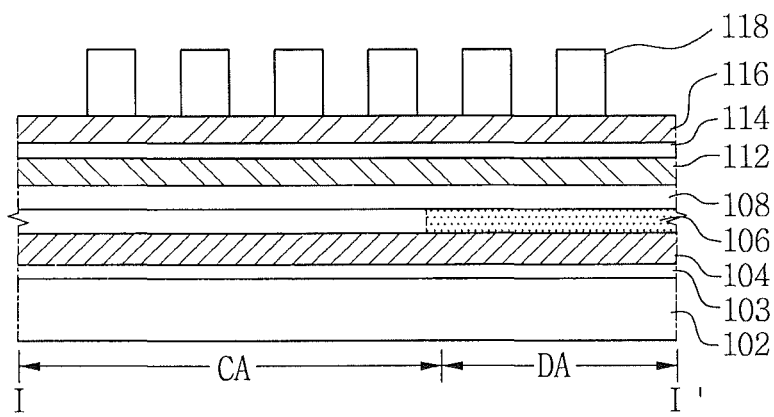
Figure 6B:
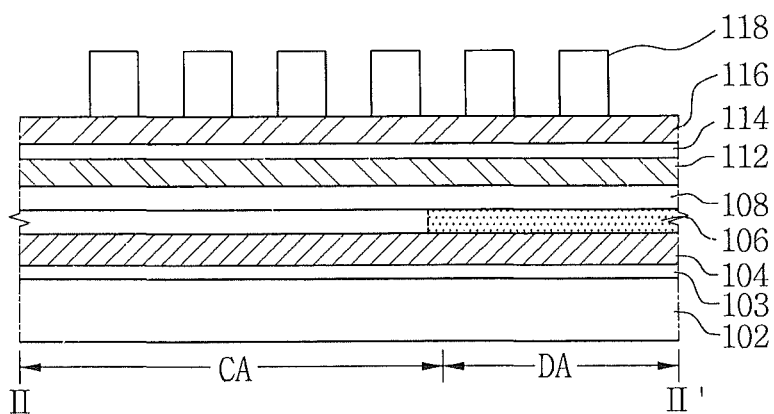
Figure 6C:
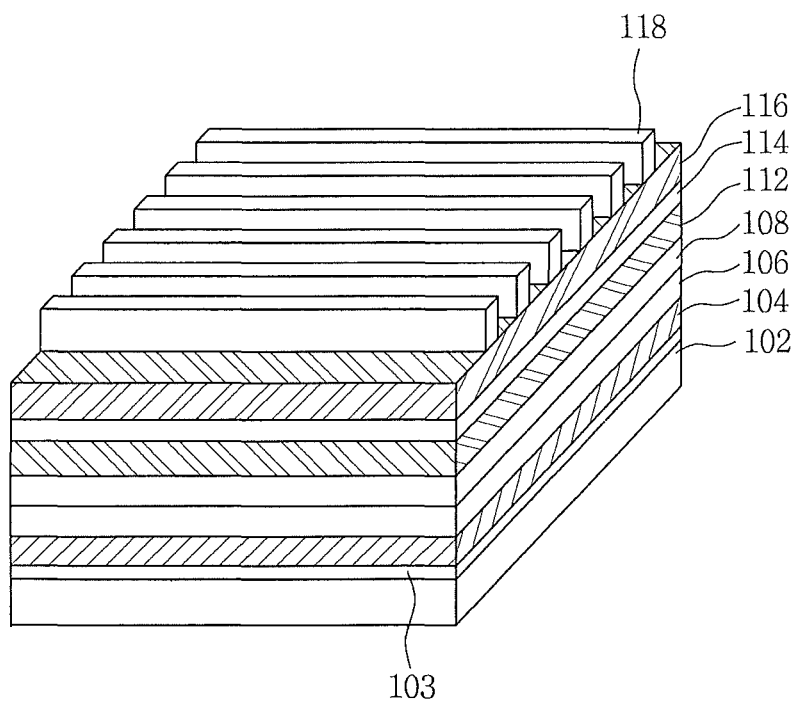
Figure 7A:
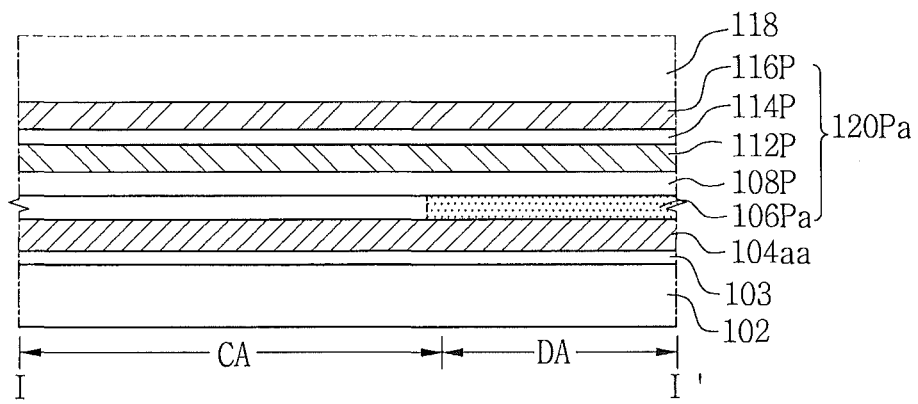
Figure 7B:
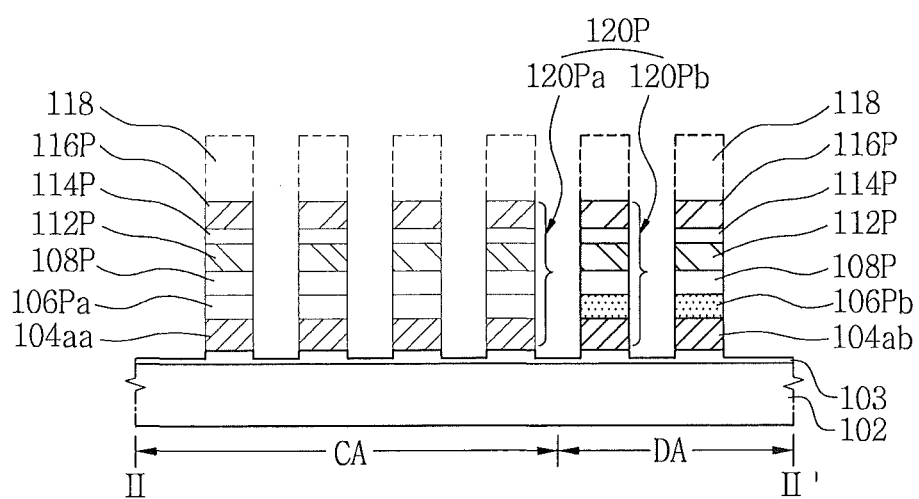
Figure 7C:
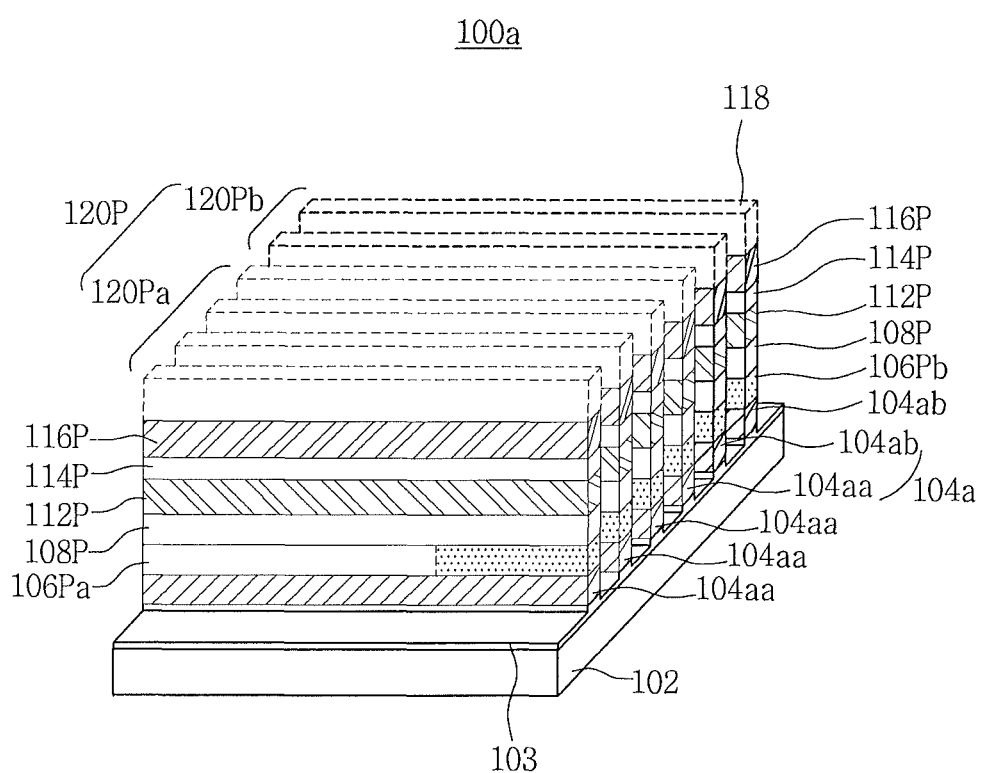

Referring to FIGS. 6A through 6C, the method of fabricating the memory device 100a may include sequentially forming a first electrode layer 112, a variable resistive layer 114, and a second electrode layer 116 on a top surface of the p-type impurity layer 108.

In addition, the method may further include forming second mask patterns 118 on a top surface of the second electrode layer 116.

The first electrode layer 112 and the second electrode layer 116 may include, for example, platinum (Pt), ruthenium (Ru), ruthenium oxide (RuOx), iridium (Ir), iridium oxide (IrOx), titanium nitride (TiN), tungsten (W), tantalum (Ta), or tantalum nitride (TaN). In another example, the first electrode layer 112 or the second electrode layer 116 may include poly-Si.

The variable resistive layer 114 may include, for example, hafnium oxide (HfOx), titanium oxide (TiOx), nickel oxide (NiOx), zirconium oxide (ZrOx), aluminum oxide (AlOx), silicon oxide (SiOx), niobium oxide (NbOx), or tungsten oxide (WOx).

The second mask patterns 118 may extend in a first direction and be spaced apart from one another in a second direction. The second mask patterns 118 may be patterned using photolithography and etching processes. The second mask patterns 118 may include silicon oxide.

In the above-described process, a thin metal silicide layer may be formed between the first electrode layer 112 and the p-type impurity layer 108.

Referring to FIGS. 7A through 7C and FIG. 2C, the method of fabricating the memory device 100a may include forming bit lines 104a having the same shape as the second mask patterns 118 under the second mask patterns 118 and forming preliminary vertical structures 120P having the same shape as the second mask patterns 118 and the bit lines 104a between the second mask patterns 118 and the bit lines 104a.

The bit lines 104a may include cell bit lines 104aa and dummy bit lines 104ab. The cell bit lines 104aa may be formed throughout the cell region CA and the dummy region DA. Referring to FIG. 2C, the dummy bit lines 104ab may be formed in the dummy region DA. Specifically, at least one dummy bit line 104ab may be formed in each of two first regions of the dummy region DA, which are on opposite sides of the cell bit lines 104aa. The dummy bit lines 104ab may be parallel to the cell bit lines 104aa.

The preliminary vertical structures 120P may include preliminary cell vertical structures 120Pa and preliminary dummy vertical structures 120Pb.

The preliminary cell vertical structures 120Pa may be formed throughout the cell region CA and the dummy region DA. The preliminary dummy vertical structures 120Pb may be formed in the dummy region DA.

The preliminary cell vertical structures 120Pa and the preliminary dummy vertical structures 120Pb may include preliminary n-type impurity patterns 106Pa and 106Pb, a preliminary p-type impurity pattern 108P, a first preliminary electrode 112P, a preliminary variable resistor 114P, and a second preliminary electrode 116P.

The preliminary n-type impurity patterns 106Pb of the preliminary dummy vertical structures 120Pb are disposed in the dummy region DA and may include a low-concentration of n-type impurities. Also, portions of the preliminary n-type impurity patterns 106Pa of the preliminary cell vertical structures 120Pa, which correspond to the dummy region DA, may include low-concentration n-type impurities (illustrated with dots).

In the above-described process, an upper portion of the buffer layer 103 formed between the bit lines 104a may be recessed to a predetermined depth.

Figure 8A:
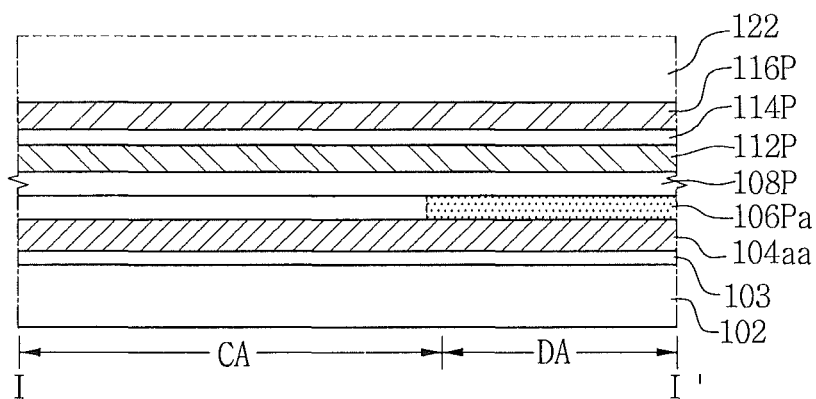
Figure 8B:
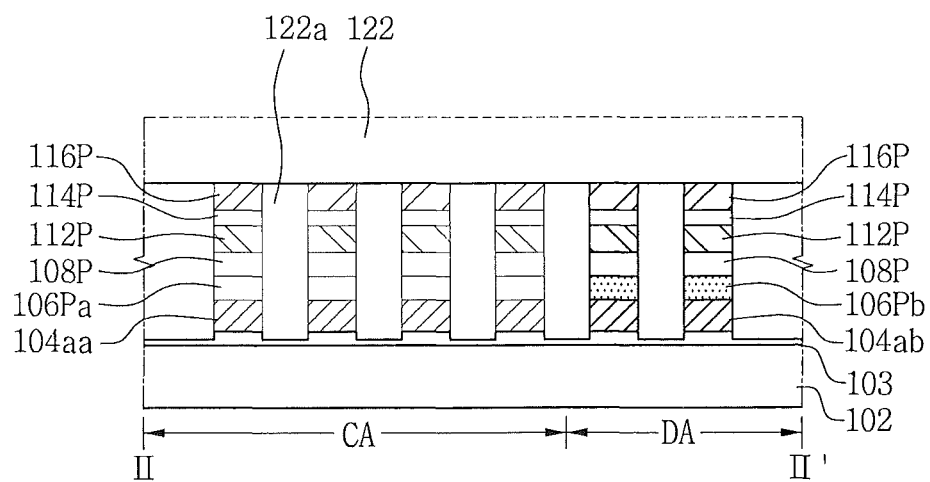
Figure 8C:
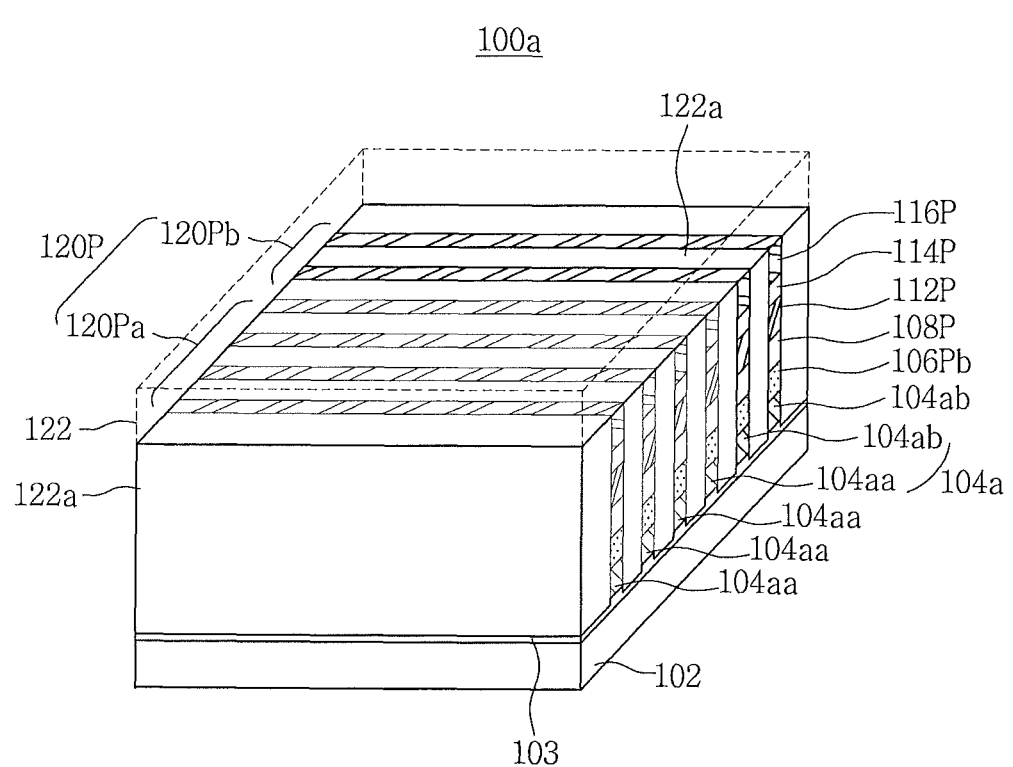

Referring to FIGS. 8A through 8C, the method of fabricating the memory device 100a may include forming planarization layer patterns 122a in the spaces between the preliminary vertical structures 120P.

The formation of the planarization layer pattern 122a may include forming a planarization layer 122 on the entire surface of the substrate 102. The formation of the planarization layer pattern 122a may include performing a planarization process on the planarization layer 122. The planarization process may include a chemical mechanical polishing (CMP) process. Due to the CMP process, a top surface of the planarization layer pattern 122a and top surfaces of the preliminary vertical structures 120P may be at the same level.

The planarization layer pattern 122a may include silicon oxide.

Figure 9A:
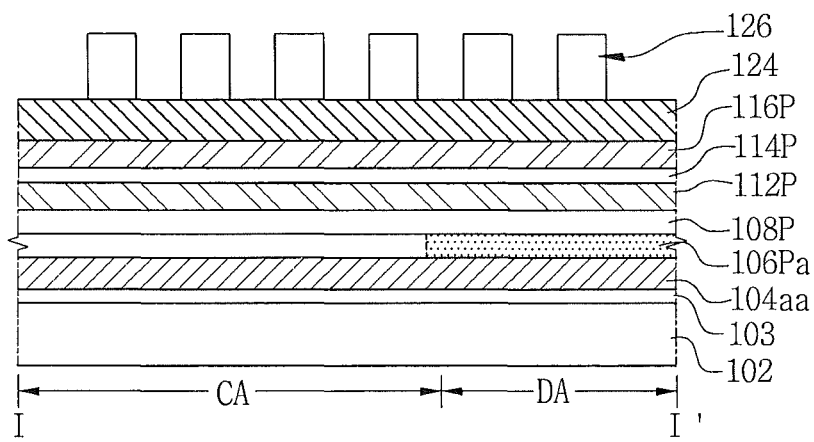
Figure 9B:
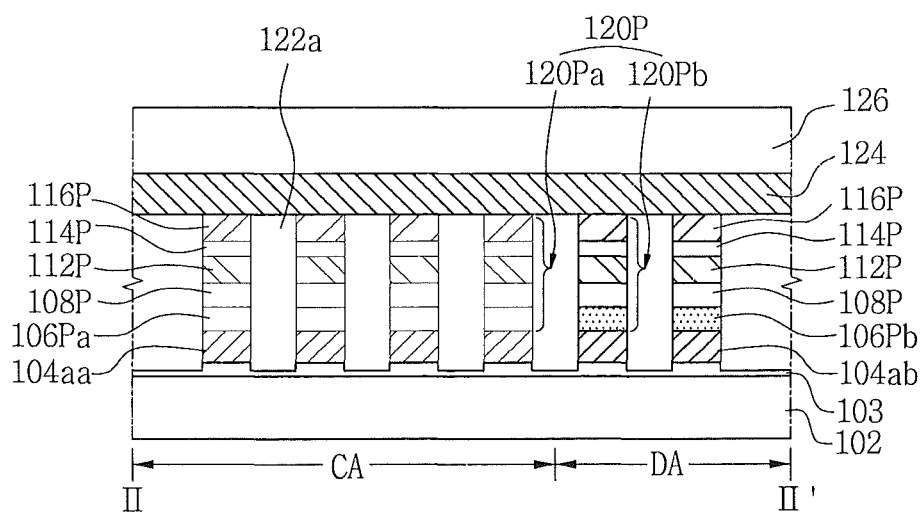
Figure 9C:
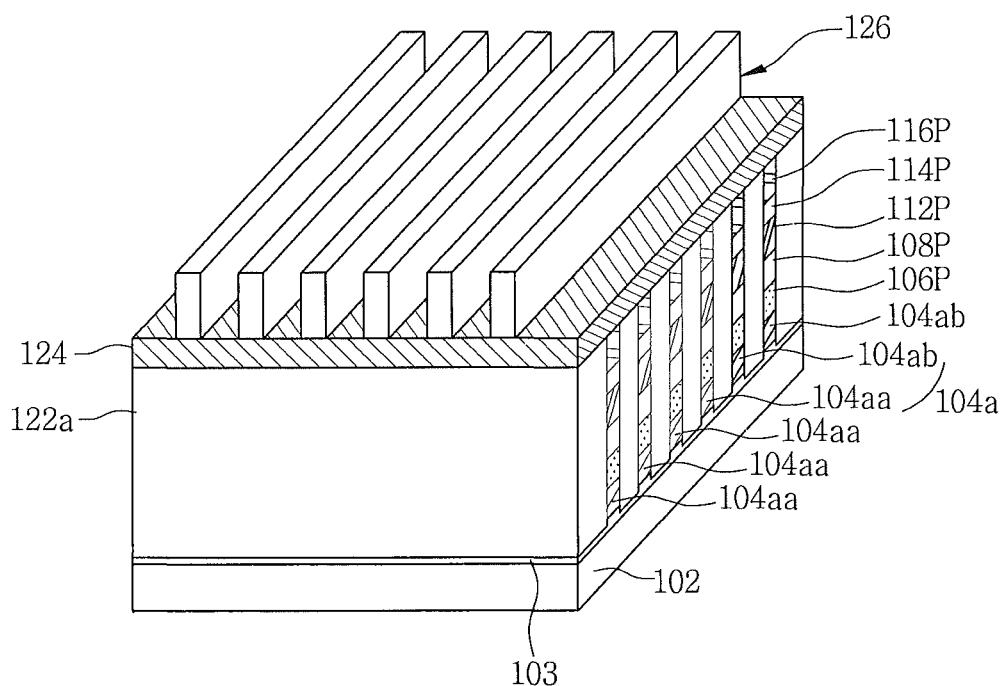
Figure 10A:
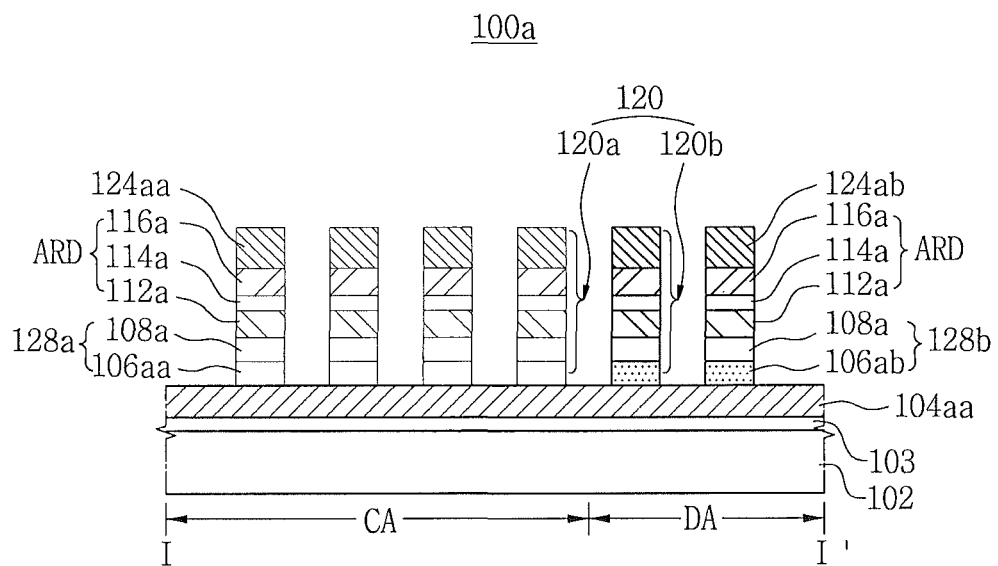
Figure 10B:
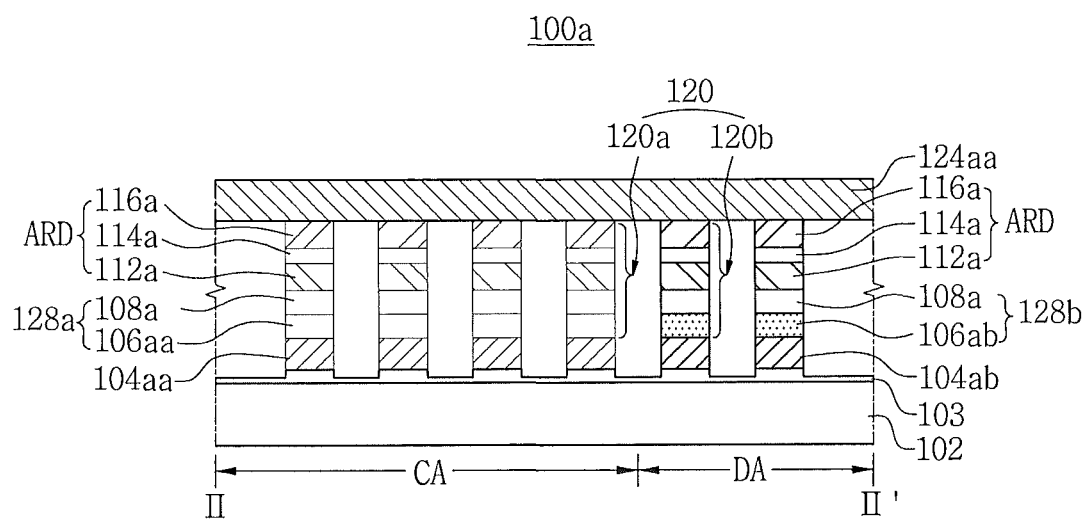
Figure 10C:
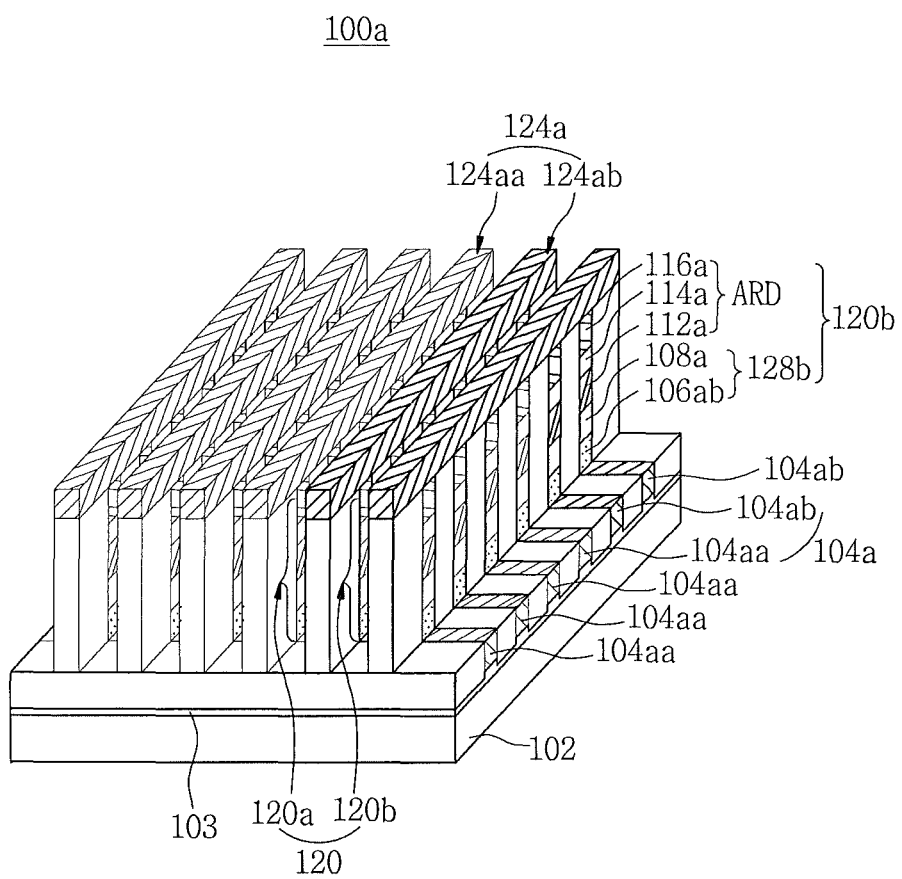
Figure 11A:
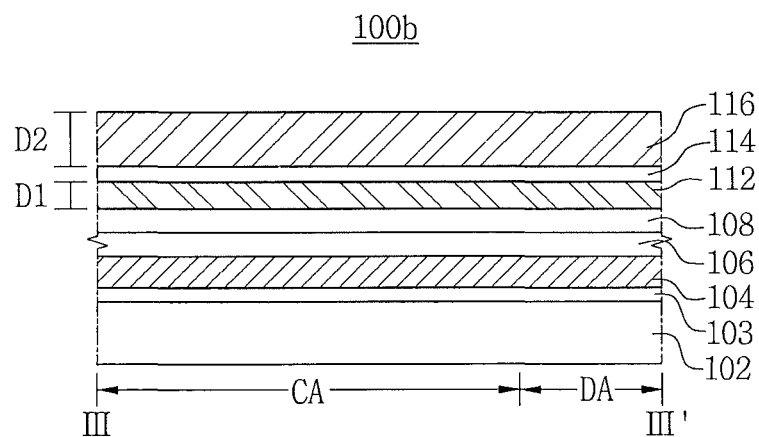
Figure 11B:
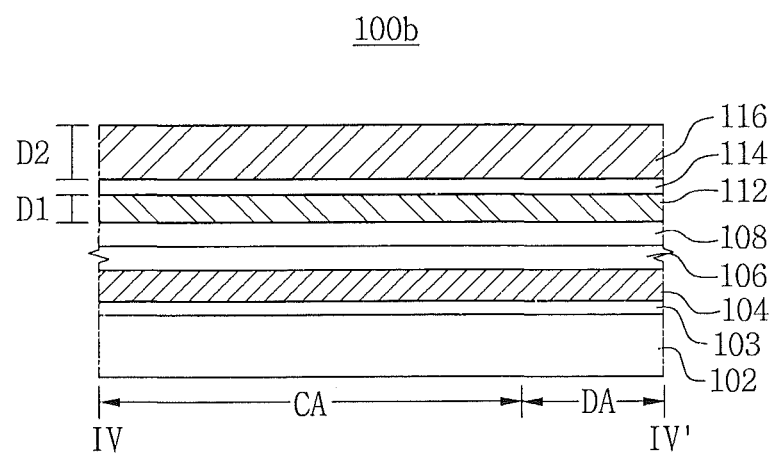
Figure 11C:
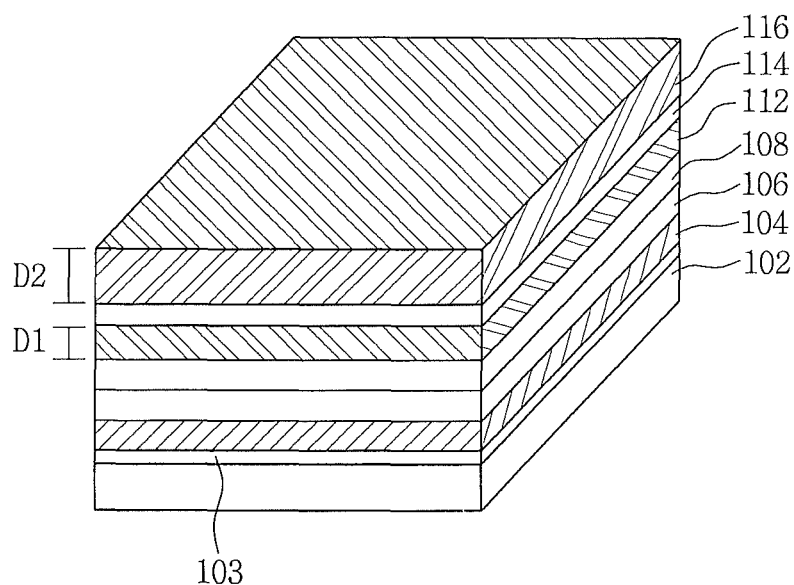

Referring to FIGS. 9A through 9C, the method of fabricating the memory device 100a may include sequentially forming a second metal layer 124 and third mask patterns 126 on the top surfaces of the preliminary vertical structures 120P and the planarization layer pattern 122a.

The second metal layer 124 may be in contact with the top surfaces of the preliminary vertical structures 120P and the top surfaces of the planarization layer pattern 122a. The second metal layer 124 may include tungsten (W), aluminum (Al), titanium nitride (TiN), or tungsten nitride (WN).

The third mask patterns 126 may extend in a second direction and be spaced apart from one another in the first direction.

The third mask patterns 126 may be formed by photolithography and etching processes. The third mask patterns 126 may include silicon oxide.

Referring to FIGS. 10A through 10C and FIG. 2C, the method of fabricating the memory device 100a may include forming word lines 124a and vertical structures 120.

The formation of the word lines 124a and the vertical structures 120 may include patterning the second metal layer 124 and the underlying preliminary vertical structures 120P using the third mask patterns 126 shown in FIG. 9A through FIG. 9C as an etch mask.

The word lines 124a may include cell word lines 124aa and dummy word lines 124ab. The cell word lines 124aa may be formed throughout the cell region CA and the dummy region DA. The dummy word lines 124ab may be formed in the dummy region DA. Specifically, at least one dummy word lines 124ab may be formed in each of second regions, which are on opposite sides of the cell region CA. The dummy word lines 124ab may be parallel to the cell word lines 124aa.

Each of the vertical structures 120 may be formed as an island extending upward from the substrate 102 in a corresponding one of regions in which the bit lines 104a intersect the word lines 124a.

The vertical structures 120 may include cell vertical structures 120a formed in the cell region CA and dummy vertical structures 120b formed in the dummy region DA.

Each of the vertical structures 120 may include a variable resistive element ARD and a diode 128a or 128b. The variable resistive element ARD and the diode 128 are electrically connected in series.

The variable resistive element ARD may include a first electrode 112a, a variable resistor 114a, and a second electrode 116a.

The diodes 128 may include cell diodes 128a and dummy diodes 128b.

Each of the cell diodes 128a may be included in the cell vertical structure 120a and include a heavily doped n-type impurity pattern 106aa and a heavily doped p-type impurity pattern 108a. Each of the dummy diodes 128b may be included in the dummy vertical structure 120b and include a lightly doped n-type impurity pattern 106ab and a heavily doped p-type impurity pattern 108a.

As described above, since the lightly doped n-type impurity pattern 106ab of each of the dummy diodes 128b has a much lower impurity concentration than does the p-type impurity pattern 108a, a p-n junction having a difference in impurity concentrations may be formed between the highly-doped p-type impurity pattern 108a and the lightly doped n-type impurity pattern 106ab that is formed in the dummy region DA.

The impurity concentration of a p-n junction diode may be reduced near the p-n junction so that the intensity of an electric field can be reduced in the p-n junction. Accordingly, a leakage current may be reduced or eliminated.

Figure 5A:
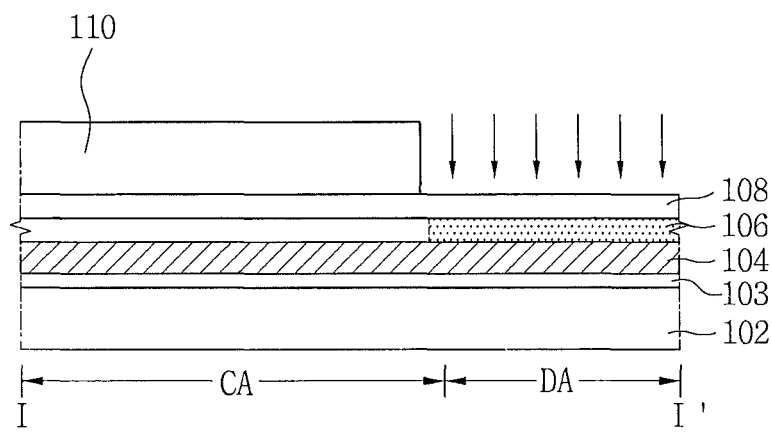
Figure 5B:
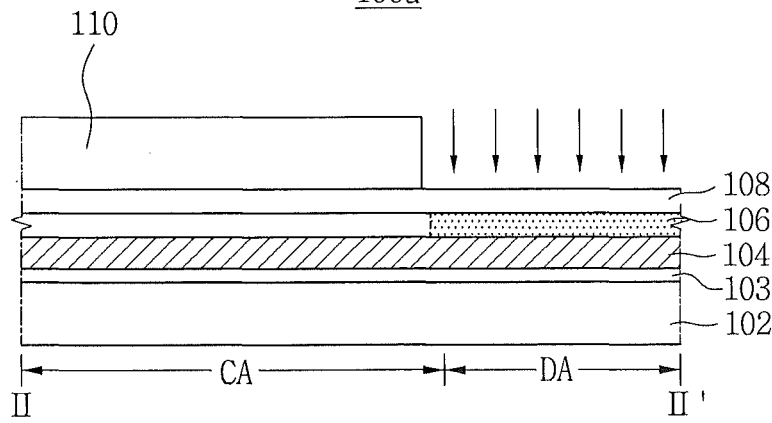
Figure 5C:
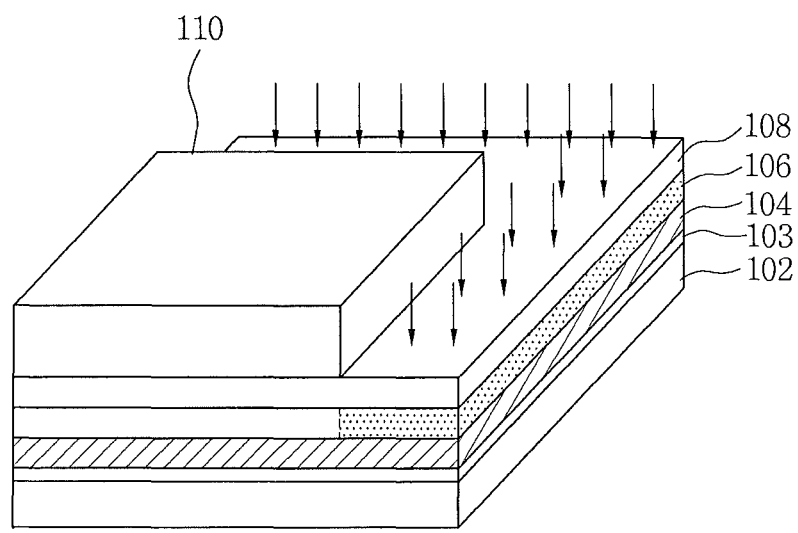

As described above, when at least one dummy bit line 104ab and at least one dummy word line 124ab are formed in the dummy region DA, the first mask pattern 110 shown in FIGS. 5A through 5C may be used as an ion implantation stop layer.

In contrast, when the dummy region DA of the substrate 102 includes first regions disposed parallel to the cell bit lines 104aa and second regions disposed parallel to the cell word lines 124aa, one dummy bit line 104ab is formed in each of the first regions and one dummy word line 124ab is formed in each of the second regions, the above-described process using the ion implantation stop layer may be omitted.

This process will now be described with reference to FIGS. 11A through 18A, FIGS. 11B through 18B, and FIG. 11C through FIG. 18C.

FIGS. 11A through 18A and FIGS. 11B through 18B are sectional views taken along lines III-III' and IV-IV' of FIG. 1 illustrating processes of a method of fabricating a memory device 100b according to further embodiments of the inventive concept.

FIGS. 11C through 18C are perspective views corresponding to the plan view of FIG. 1, which illustrate processes of the method of fabricating the memory device 100b. Here, an example case in which a dummy region includes a pair of first regions that are each disposed parallel to the cell bit lines and on opposite sides of the cell bit lines and a pair of second regions that are each disposed parallel to the cell word lines and on opposite of the cell word lines. One dummy bit line is formed in each of the first regions, and one dummy word line is formed in each of the second regions.

Referring to FIGS. 11A through 11C and FIG. 2C, the method of fabricating the memory device 100b may include sequentially forming a buffer layer 103, a first metal layer 104, an n-type impurity layer 106, a p-type impurity layer 108, a first electrode layer 112, a variable resistive layer 114, and a second electrode layer 116 on the substrate 102.

The substrate 102 may include a cell region CA and a dummy region DA. The substrate 102 may include a silicon substrate.

The buffer layer 103 may be formed on the entire surface of the substrate 102. The buffer layer 103 may include silicon oxide.

The first metal layer 104 may be formed on the entire surface of the buffer layer 103. The first metal layer 104 may include tungsten, aluminum, titanium nitride, or tungsten nitride.

The formation of the n-type impurity layer 106 and the p-type impurity layer 108 may include doping n-type impurities and p-type impurities into an amorphous silicon layer, respectively, using an ion diffusion process or an ion implantation process.

The ion diffusion process may include diffusing ions into the intrinsic amorphous silicon layer in-situ, and the ion implantation process may include implanting plasma-type ions into the amorphous silicon layer in a vacuum state.

For example, an ion doping process according to the inventive concept may include an ion implantation process.

The n-type impurities may be a Group-V element, such as phosphorus, arsenic, or antimony. The p-type impurities may be a Group-III element, such as boron, indium, or gallium.

The formation of the first electrode layer 112 and the second electrode layer 116 may include forming the second electrode layer 116 to a thickness D2 that is greater than a thickness D1 of the first electrode layer 112. The first electrode layer 112 and the second electrode layer 116 may include platinum (Pt), ruthenium (Ru), ruthenium oxide (RuOx), iridium (Ir), iridium oxide (IrOx), titanium nitride (TiN), tungsten (W), tantalum (Ta), or tantalum nitride (TaN).

The variable resistive layer 114 may include hafnium oxide (HfOx), titanium oxide (TiOx), nickel oxide (NiOx), zirconium oxide (ZrOx), aluminum oxide (AlOx), silicon oxide (SiOx), niobium oxide (NbOx), or tungsten oxide (WOx).

Subsequently, the n-type impurity layer 106 and the p-type impurity layer 108 into which the impurities are doped may be annealed to form poly-Si layers doped with impurities.

In the above-described process, a thin metal silicide layer may be formed between the first metal layer 104 and the n-type impurity layer 106. Similarly, a thin metal silicide layer may be formed between the first electrode layer 112 and the p-type impurity layer 108.

Figure 12A:
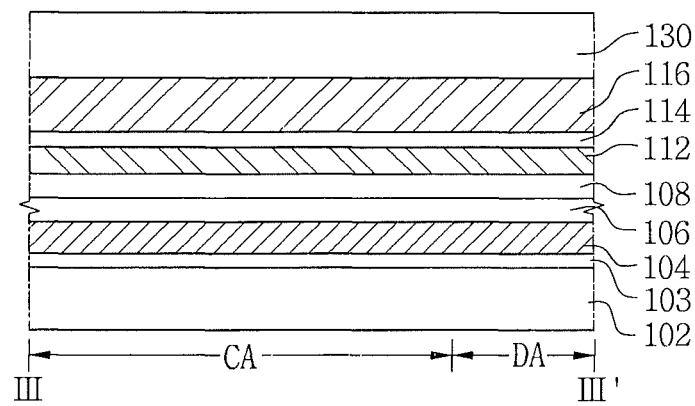
Figure 12B:
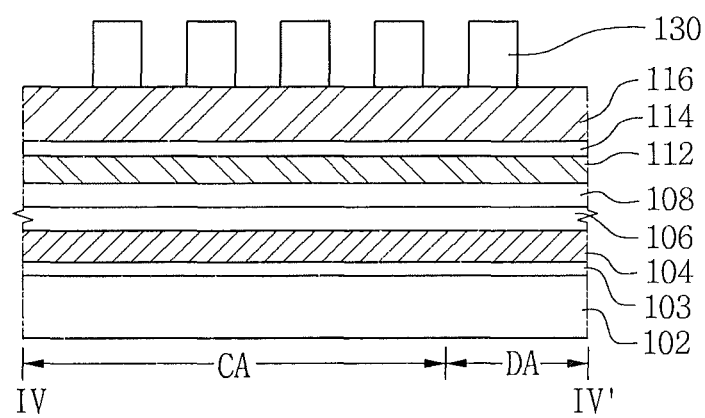
Figure 12C:
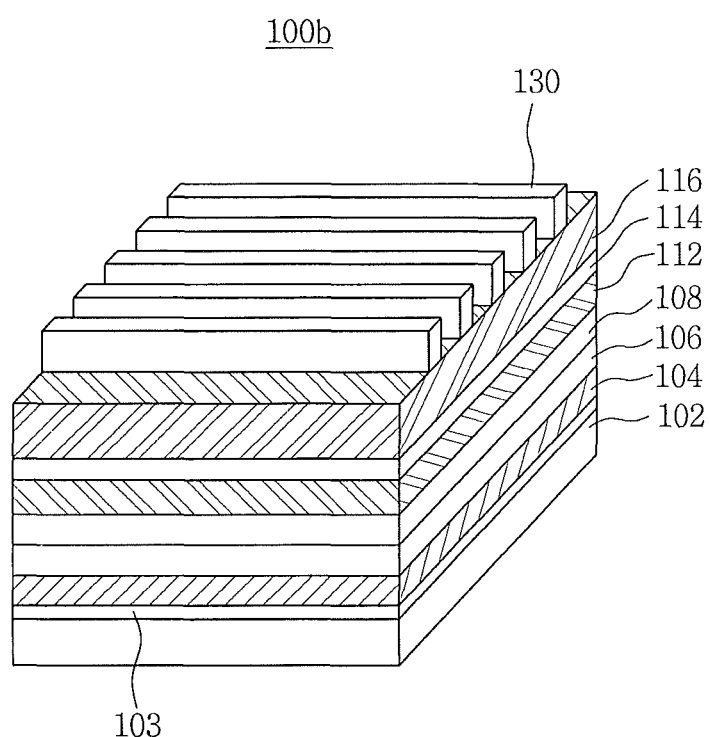
Figure 13A:
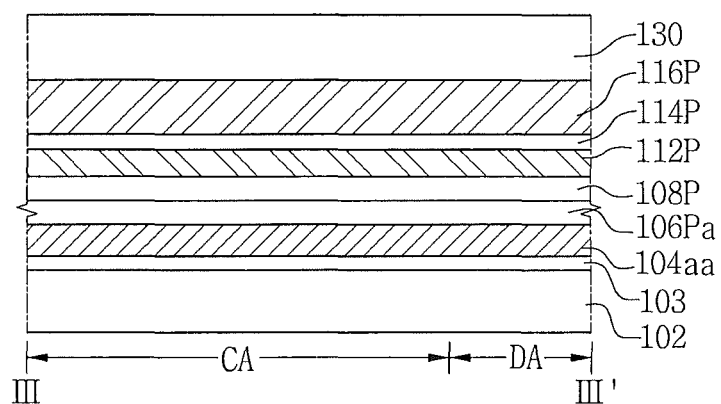
Figure 13B:
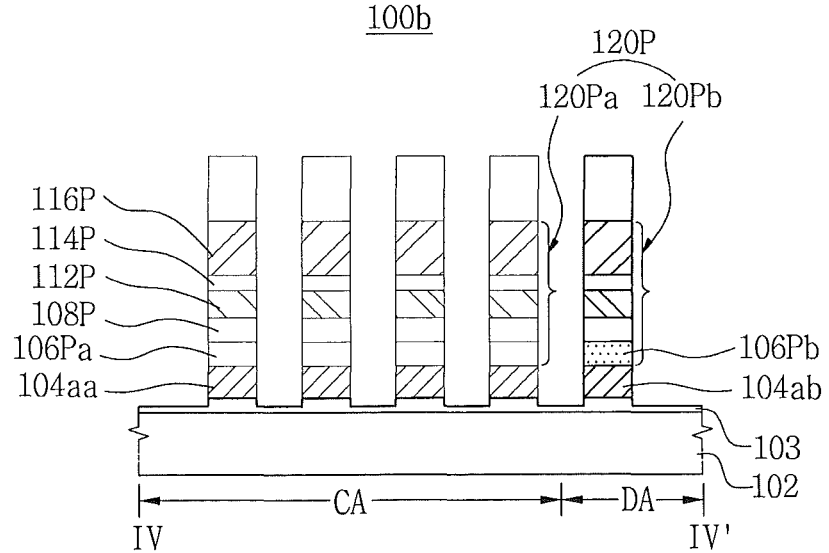
Figure 13C:
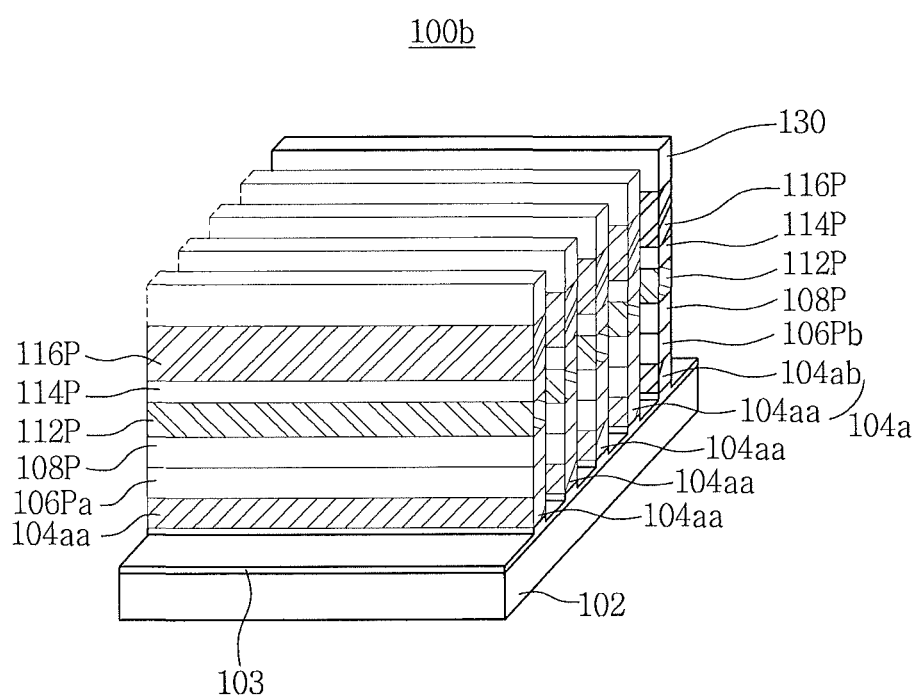

Referring to FIGS. 12A through 12C, the method of fabricating the memory device 100b may include forming first mask patterns 130 on the second electrode layer 116.

The first mask patterns 130 may extend in a first direction and be spaced apart from one another in a second direction.

The first mask patterns 130 may be formed by photolithography and etching processes. The first mask patterns 130 may include a silicon oxide layer.

Referring to FIGS. 13A through 13C and FIG. 2C, the method of fabricating the memory device 100b may include forming preliminary vertical structures 120P having the same shape as the first mask patterns 130 under the first mask patterns 130 and forming bit lines 104a under the preliminary vertical structures 120P.

The preliminary vertical structures 120P may include a preliminary cell vertical structure 120Pa and a preliminary dummy vertical structure 120Pb.

The bit lines 104a may include cell bit lines 104aa and dummy bit lines 104ab.

The preliminary cell vertical structures 120Pa and the cell bit lines 104aa may be formed throughout the cell region CA and the dummy region DA. The dummy region DA may include two first regions that are disposed parallel to the preliminary cell vertical structures 120Pa and opposite each other, and one preliminary dummy vertical structure 120Pb and one dummy bit line 104ab may be formed in each of the first regions of the dummy region DA.

The preliminary cell vertical structures 120Pa and the preliminary dummy vertical structures 120Pb may include a preliminary n-type impurity pattern 106P, a preliminary p-type impurity pattern 108P, a first preliminary electrode 112P, a preliminary variable resistor 114P, and a second preliminary electrode 116P.

The preliminary n-type impurity pattern 106P and the preliminary p-type impurity pattern 108P, which may form a preliminary diode, may be patterned in a subsequent process to form a diode. Also, the first preliminary electrode 112P, the preliminary variable resistor 114P, and the second preliminary electrode 116P, which may form a preliminary variable resistive element, may be patterned in a subsequent process to form a variable resistive element.

In the above-described process, an upper portion of the buffer layer 103 that is between the bit lines 104a may be recessed to a predetermined depth.

Figure 14A:
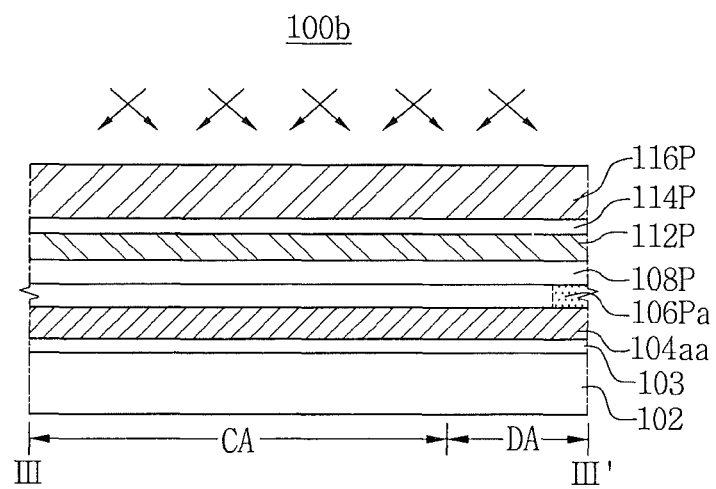
Figure 14B:
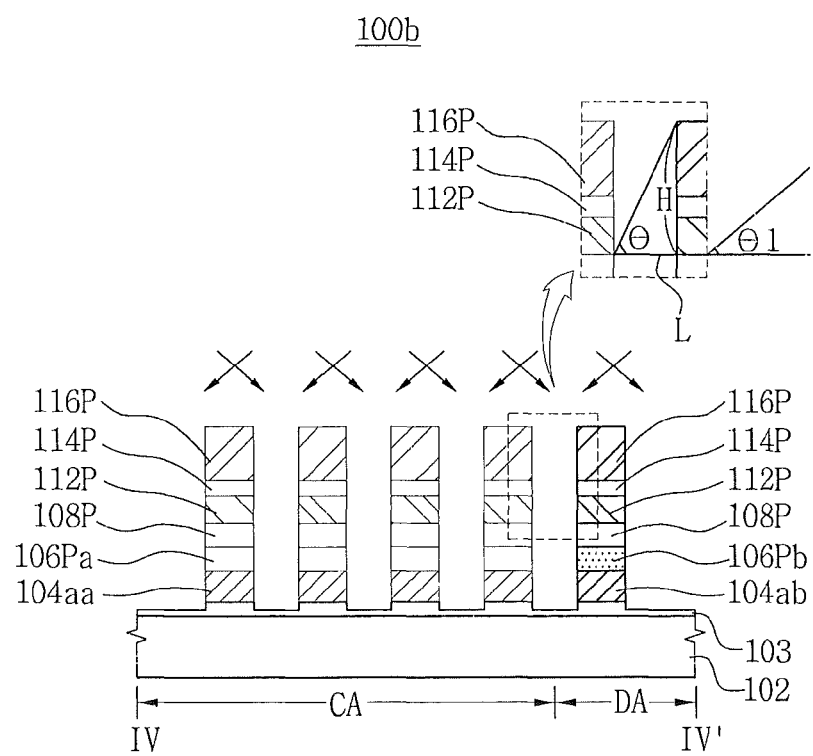
Figure 14C:
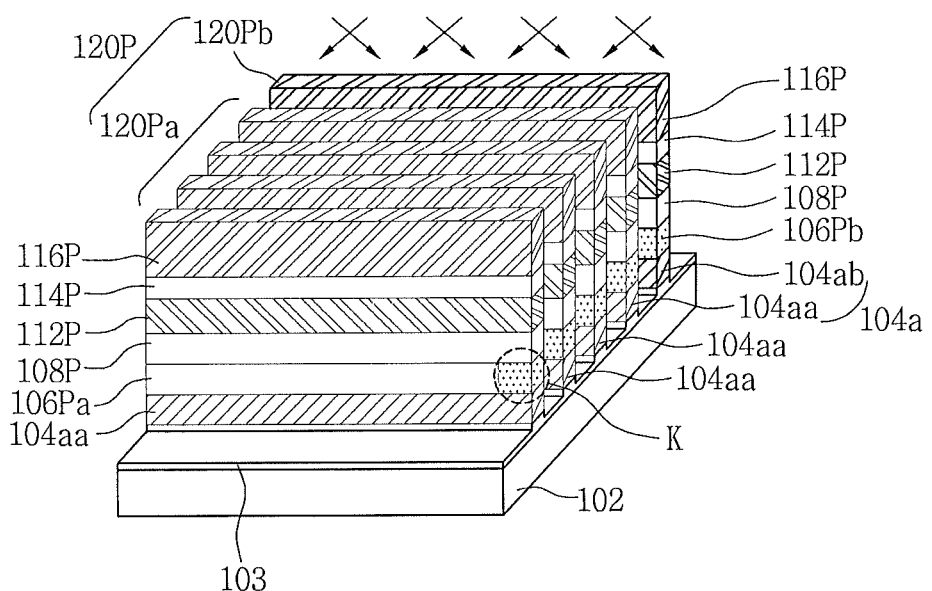

Referring to FIGS. 14A through 14C, the method of fabricating the memory device 100b may include performing a process of implanting first impurities into a preliminary impurity pattern of the dummy region DA.

The first ion implantation process may include implanting p-type impurities into the preliminary n-type impurity pattern 106P of the preliminary dummy vertical structure 120Pb or implanting n-type impurities into the preliminary p-type impurity pattern 108P of the dummy region DA.

For example, the method of fabricating the memory device 100b may include implanting p-type impurities into the preliminary n-type impurity pattern 106Pb of the dummy region DA. Specifically, referring to FIGS. 14C and 2C, the method of fabricating the memory device 100b may include implanting p-type impurities into the preliminary n-type impurity pattern 106Pb included in the preliminary dummy vertical structures 120Pb of the dummy region DA.

To this end, an ion implantation angle may be calculated in consideration of a distance L between the preliminary cell vertical structures 120Pa and the preliminary dummy vertical structures 120Pb and the height H of the layers stacked on a top surface of the preliminary p-type impurity pattern 108P. A value θ obtained by H/L should be greater than an ion implantation angle θ1 so that impurities cannot be implanted into the impurity patterns 106Pa and 108P of the preliminary cell vertical structure 120Pa (except for exposed end portions K thereof) but are implanted into the preliminary dummy vertical structure 120Pb of the dummy region DA since the side surfaces of the preliminary dummy vertical structures 120Pb on each end of the device are exposed.

The sum H may be increased to obtain a value θ greater than the ion implantation angle θ1. To this end, the second preliminary electrode 116P may be formed to have a greater height than the first preliminary electrode 112P. For this reason, the second electrode layer 116 may be formed to a greater thickness than the first electrode layer 112 in the processes described above with reference to FIGS. 11A through 11C.

The implanted impurities may be implanted at a predetermined angle in all directions. Accordingly, impurities may be implanted not only into the preliminary dummy vertical structure 120Pb shown in FIG. 14C but also into exposed portions K of both sides of each of the preliminary cell vertical structures 120Pa. The exposed portions K of each of the preliminary cell vertical structures 120Pa, into which impurities are implanted, may be removed during a subsequent process.

As described above, when p-type impurities are implanted into the preliminary n-type impurity pattern 106P, the implanted p-type impurities may compensate for a donor of the preliminary n-type impurity pattern 106P. Accordingly, the concentration of the n-type impurities contained in the preliminary n-type impurity pattern 106P may be reduced.

Figure 15A:
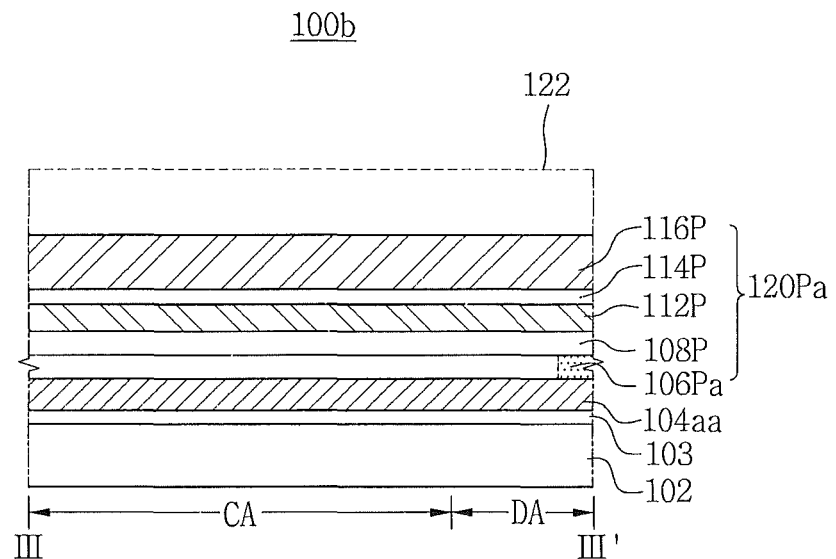
Figure 15B:
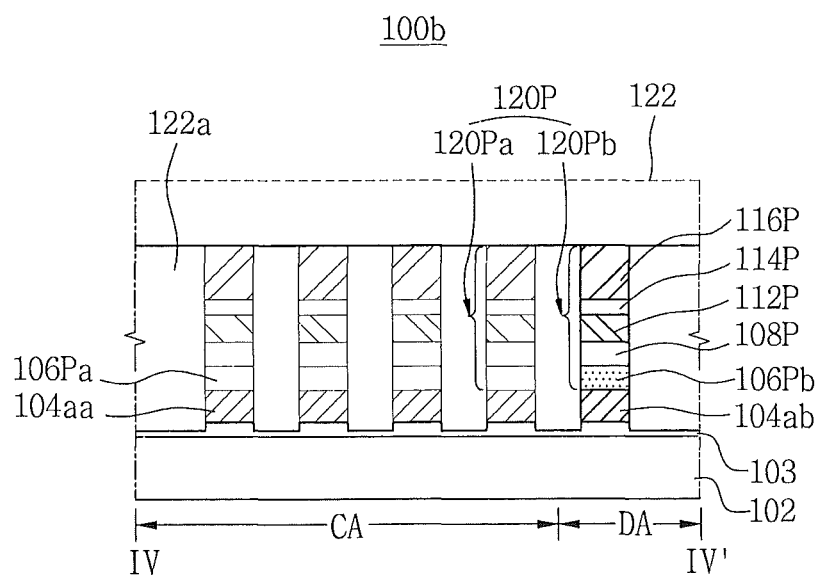
Figure 15C:
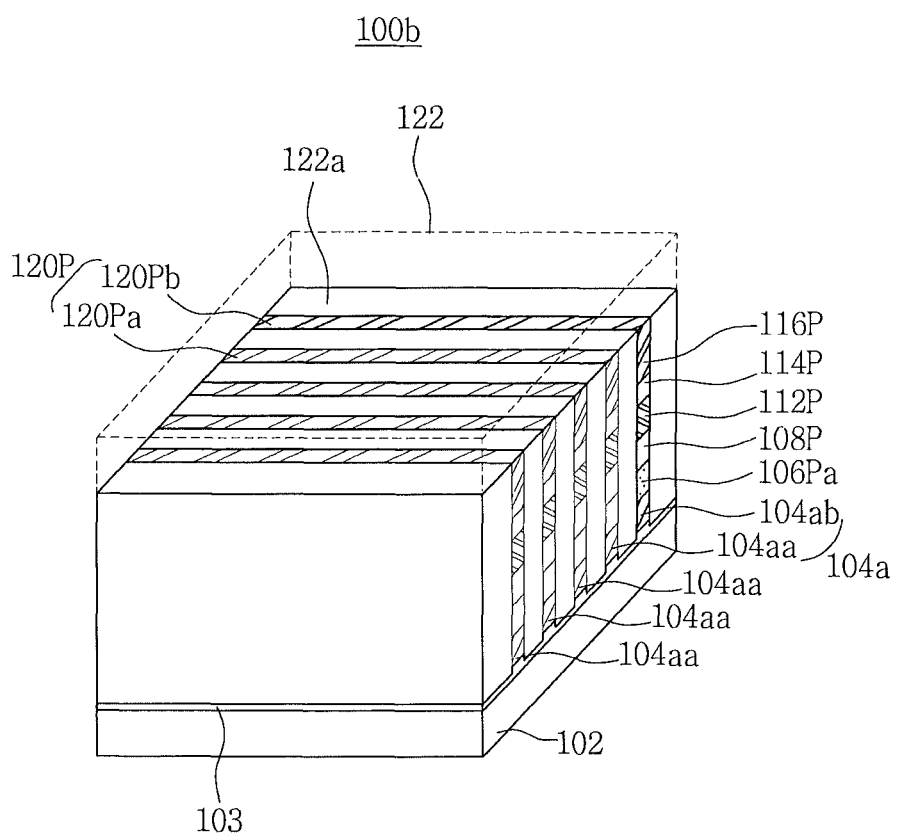

Referring to FIGS. 15A through 15C, the method of fabricating the memory device 100b may include forming planarization layer patterns 122a to fill spaces between the preliminary cell vertical structures 120Pa and the preliminary dummy vertical structures 120Pb.

The formation of the planarization layer pattern 122a may include forming a planarization layer 122 on the entire surface of the substrate 102. The formation of the planarization layer pattern 122a may include performing a planarization process on the planarization layer 122. The planarization process may include a CMP process. Due to the CMP process, a top surface of the planarization layer pattern 122a and top surfaces of the preliminary vertical structures 120P may be at the same level.

The planarization layer pattern 122a may include silicon oxide.

Figure 16A:
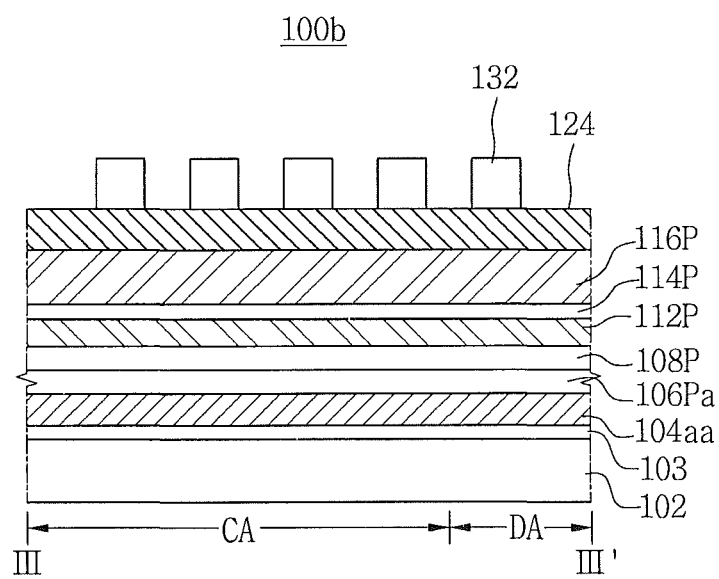
Figure 16B:
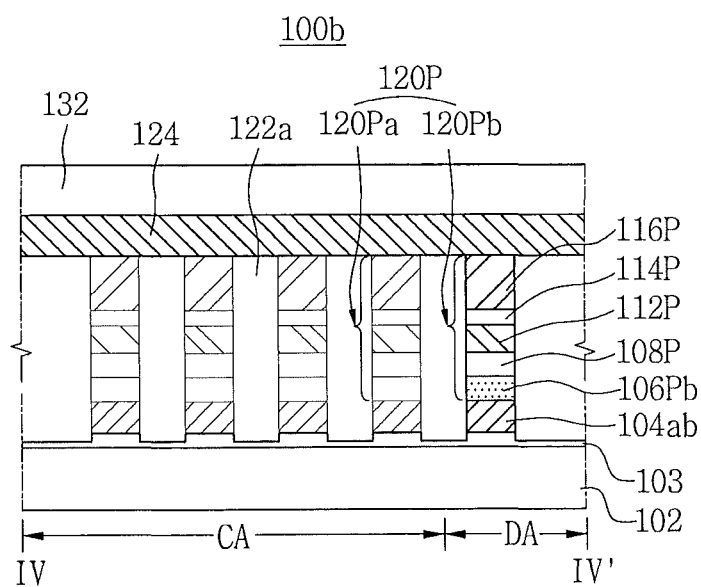
Figure 16C:
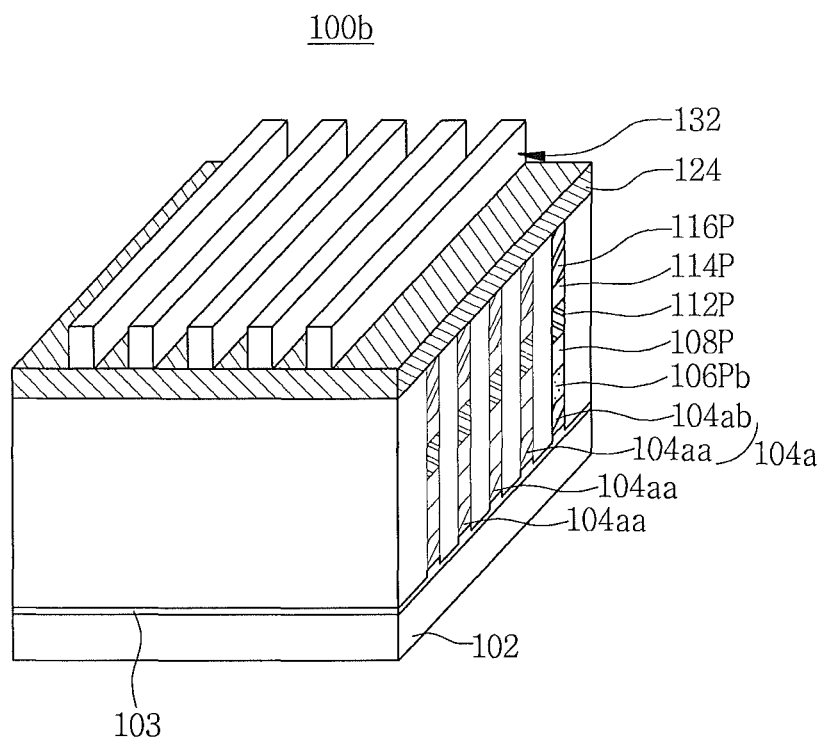

Referring to FIGS. 16A through 16C, the method of fabricating the memory device 100b may include sequentially forming a second metal layer 124 and second mask patterns 132 on top surfaces of the preliminary vertical structures 120P and the planarization layer pattern 122a. The second metal layer 124 may include tungsten, aluminum, titanium nitride, and tungsten nitride.

The second mask patterns 132 may be formed by photolithography and etching processes. The second mask patterns 132 may be formed in a second direction and intersect the bit lines 104a. The second mask patterns 132 may be spaced a predetermined distance apart from one another in a first direction that is generally perpendicular to the second direction.

Referring to FIGS. 17A through 17C and FIG. 2C, the method of fabricating the memory device 100b may include forming vertical structures 120 and forming word lines 124a on top surfaces of the vertical structures 120.

The formation of the word lines 124a may include etching portions of the second metal layer 124 that are exposed between the second mask patterns 132 (see FIG. 16A through 16C).

The word lines 124a may include cell word lines 124aa and dummy word lines 124ab. The cell word lines 124aa may be formed throughout the cell region CA and the dummy region DA. The dummy word lines 124ab may be respectively formed in second regions of the dummy region DA, which are parallel to the cell word lines 124aa and opposite each other.

The vertical structures 120 may include cell vertical structures 120a and dummy vertical structures 120b. The cell vertical structures 120a may be formed in the cell region CA. The dummy vertical structures 120b may be formed in the dummy region DA. The formation of the vertical structures 120 may include patterning cell vertical structures 120a and dummy vertical structures 120b using the second mask patterns 132 as an etch mask. The cell vertical structures 120a may each be islands that extend upwardly from the substrate 102 in each of regions in which the word lines 124a intersect the bit lines 104a.

Figure 17A:
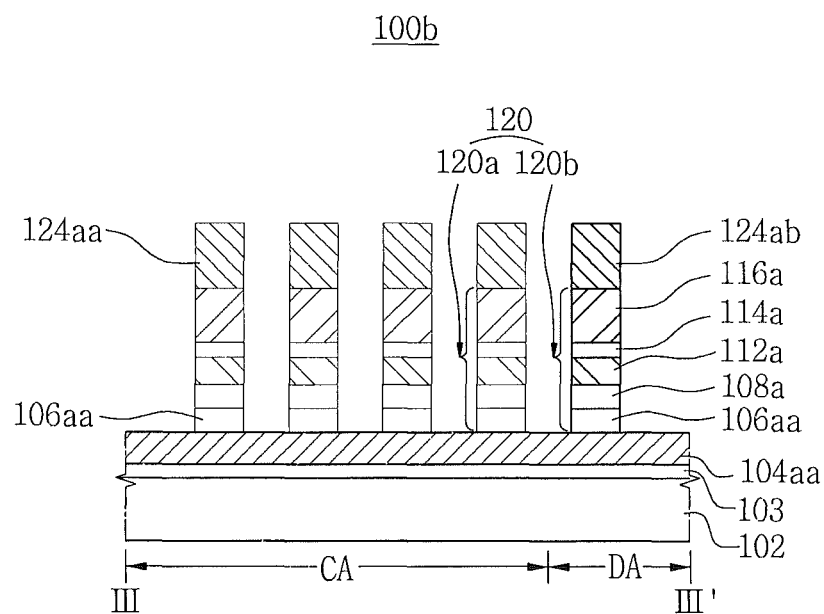

As shown in FIG. 17A, the dummy vertical structures 120b and the cell vertical structures 120a, which are in contact with the dummy word lines 124ab, may include a heavily doped n-type impurity pattern 106aa, a heavily doped p-type impurity pattern 108a, a first electrode 112a, a variable resistor 114a, and a second electrode 116a, which are stacked sequentially.

Figure 17B:
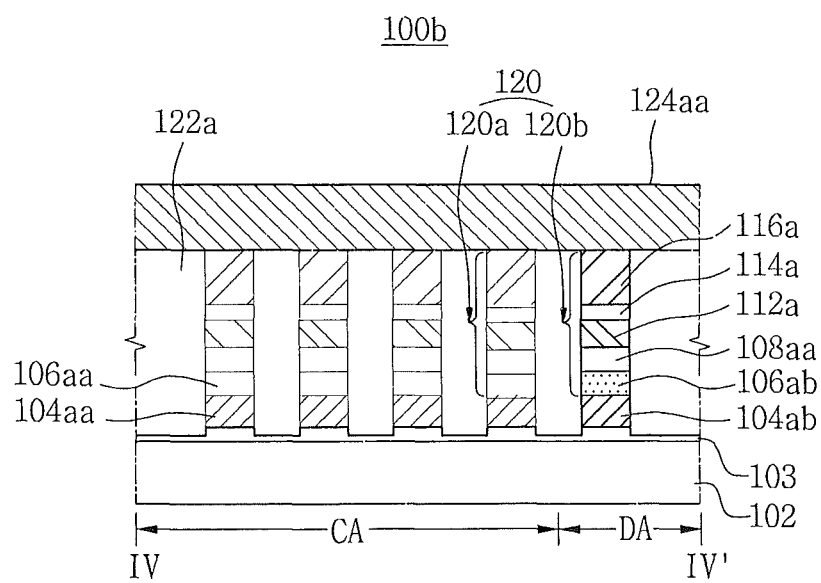

As shown in FIG. 17B, some of the dummy vertical structures 120b, which are in contact with top surfaces of the dummy bit lines 104ab, may include a lightly doped n-type impurity pattern 106ab, a heavily doped p-type impurity pattern 108a, a first electrode 112a, a variable resistor 114a, and a second electrode 116a, which are stacked sequentially.

The lightly doped n-type impurity pattern 106ab may be formed by the first ion implantation process described above with reference to FIGS. 13A through 13C.

In contrast, as described above, the heavily doped n-type impurity pattern 106aa of the dummy vertical structure 120b that is in contact with the dummy word line 124ab may still contain high-concentration n-type impurities.

Figure 17C:
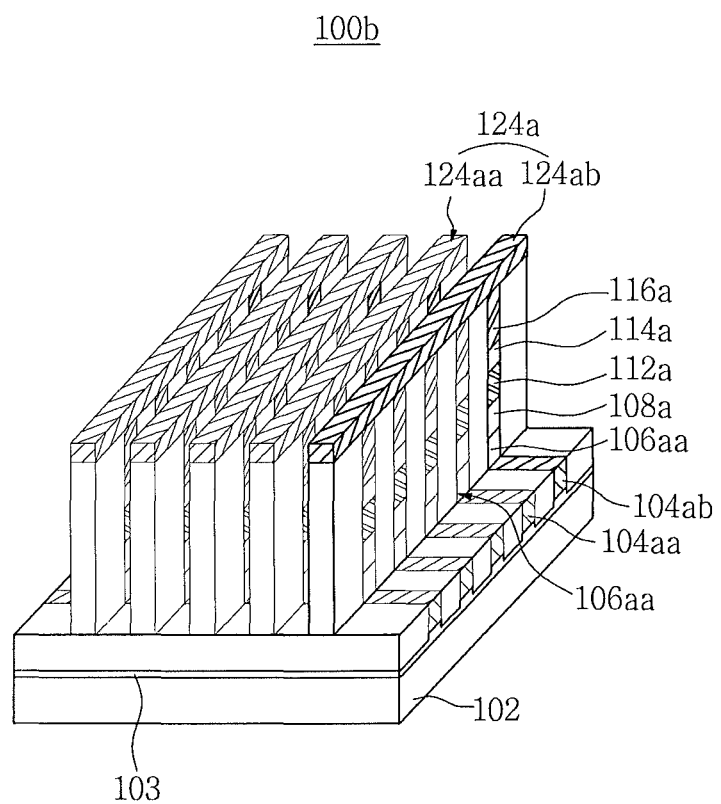
Figure 18A:
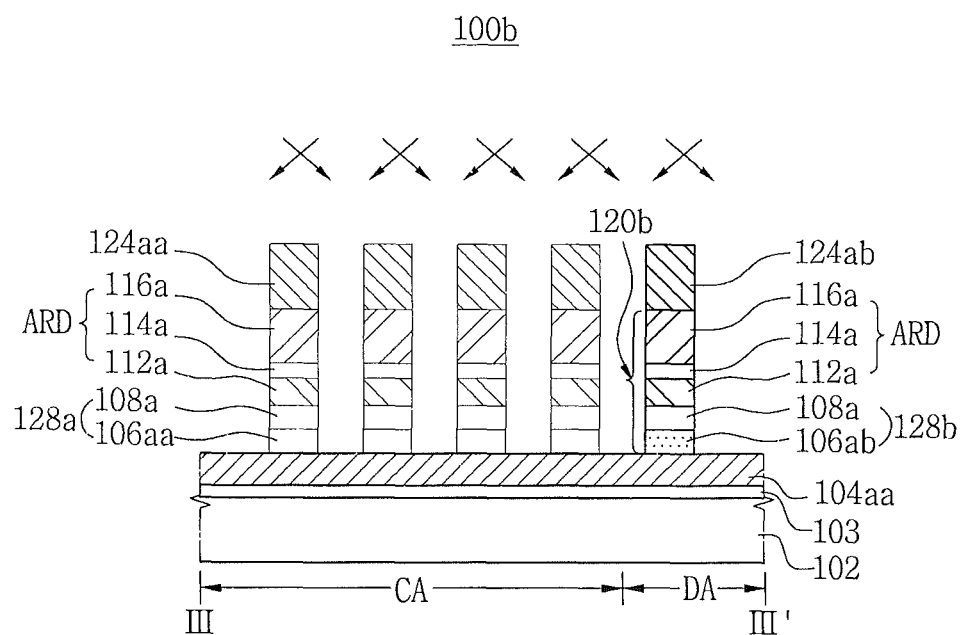
Figure 18B:
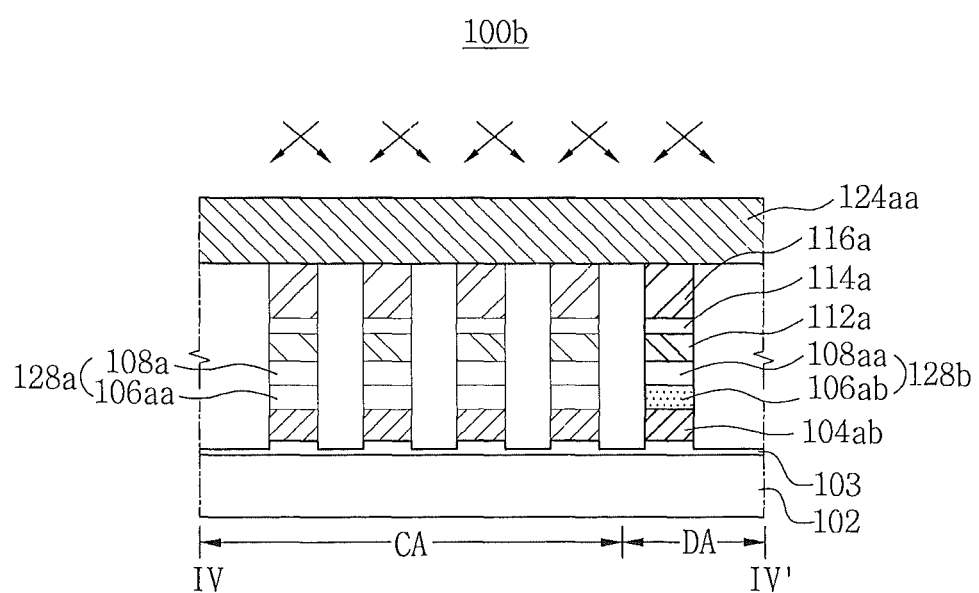
Figure 18C:
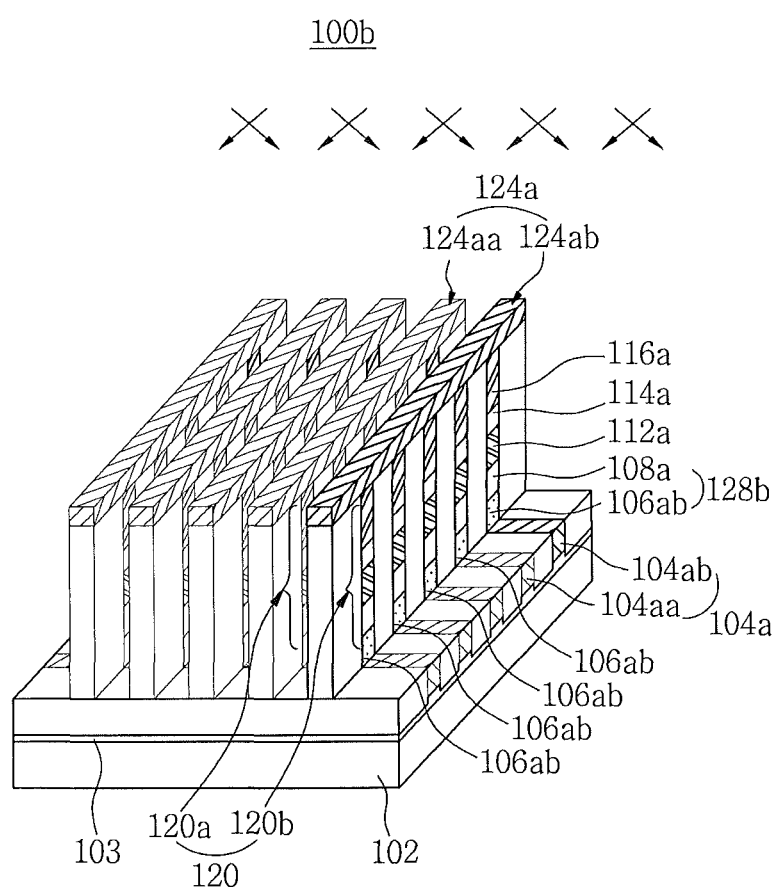

Referring to FIGS. 18A through 18C, the method of fabricating the memory device 100b may include a second ion implantation process of doping impurities into the heavily doped n-type impurity pattern 106*aa* of the dummy vertical structure 120*b* shown in FIGS. 17A through 17C.

Specifically, the second ion implantation process may include implanting p-type impurities into the n-type impurity pattern 106*aa* formed below the dummy word line 124*ab* to form the lightly doped n-type impurity pattern 106*ab*.

The second ion implantation process may be performed under the same condition regarding the ion implantation angle as the above-described first ion implantation process.

Due to the above-described processes, each of the cell vertical structures 120*a* may include a cell diode 128*a* and a variable resistive element ARD, which are connected in series, and each of the dummy vertical structures 120*b* may include a dummy diode 128*b* and a variable resistive element ARD, which are connected in series.

The cell diode 128*a* may include a heavily doped n-type impurity pattern 106*aa* and a heavily doped p-type impurity pattern 108*a*. The dummy diode 128*b* may include a lightly doped n-type impurity pattern 106*ab* and a heavily doped p-type impurity pattern 108*b*.

The variable resistive element ARD may include a first electrode 112*a*, a variable resistor 114*a*, and a second electrode 116*a*.

In the above-described construction, when the lightly doped n-type impurity pattern 106*ab* of the dummy diodes 128*b* has a much lower impurity concentration than does the p-type impurity pattern 108*a*, a p-n junction having a large difference in impurity concentrations may be formed between the p-type impurity pattern 108*a* and the lightly doped n-type impurity pattern 106*ab* formed in the dummy region DA. The impurity concentration of the p-n junction diode may be reduced near a p-n junction so that the intensity of an electric field can be reduced in the p-n junction. Accordingly, a leakage current may be reduced or eliminated.

In a subsequent process, a planarization layer pattern may be further formed to fill spaces between the vertical structures 120.

Figure 19:
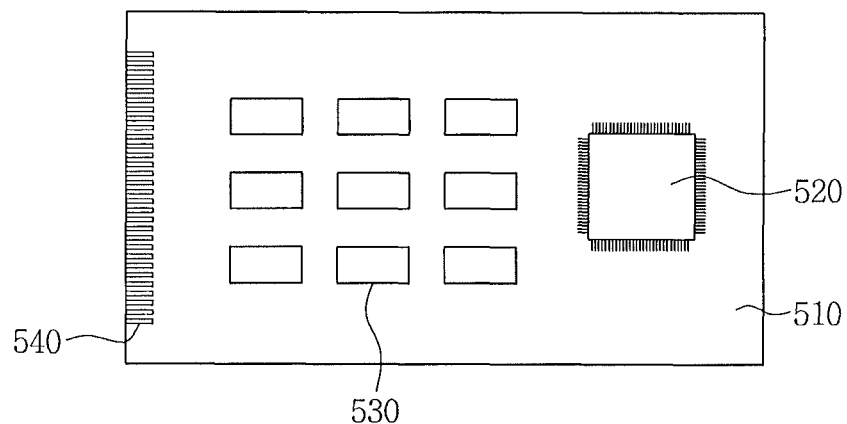
FIG. 19 is a conceptual diagram of a semiconductor module including a memory device according to embodiments of the inventive concept.

FIG. 19 is a conceptual diagram of a semiconductor module 500 including a memory device 100*a* or 100*b* fabricated according to embodiments of the inventive concept.

Referring to FIG. 19, the semiconductor module 500 according to the embodiments of the inventive concept may include the memory device 100*a* or 100*b*, which may be mounted on a semiconductor module substrate 510. The semiconductor module 500 may further include a microprocessor 520 mounted on the semiconductor module substrate 510. Input/output (I/O) terminals 540 may be disposed on at least one side of the semiconductor module substrate 510. The semiconductor module 500 may include one or more memory devices 530 which may be implemented as the memory device 100*a* or 100*b*. The semiconductor module 500 may be, for example, a memory card or a solid-state drive (SSD).

Figure 20:
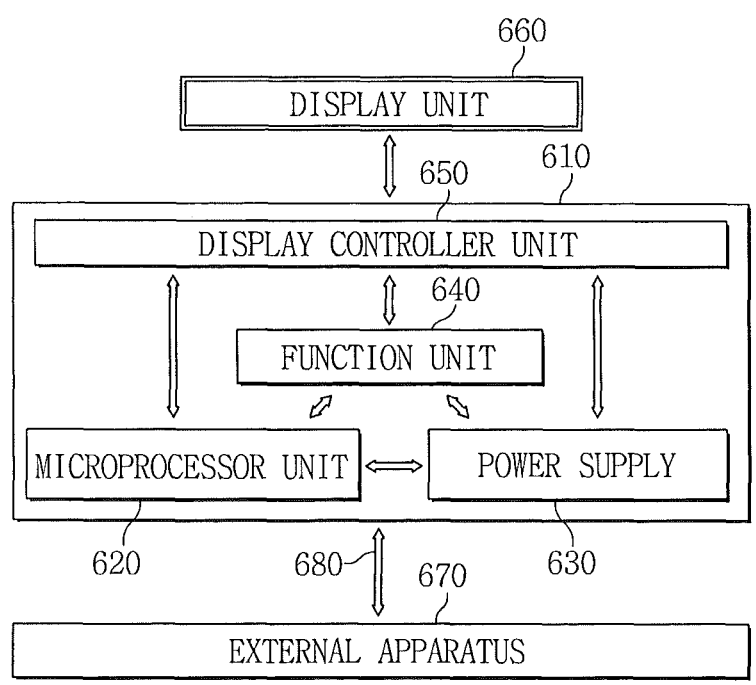
FIG. 20 is a conceptual block diagram of an electronic system including a memory device according to embodiments of the inventive concept.

FIG. 20 is a conceptual block diagram of an electronic system 600 including a memory device 100*a* or 100*b*.

Referring to FIG. 20, the memory device 100*a* or 100*b* may be applied to the electronic system 600. The electronic system 600 may include a body 610, a microprocessor unit 620, a power supply 630, a function unit 640, and/or a display controller unit 650. The body 610 may be a system board or mother board having a printed circuit board (PCB). The microprocessor unit 620, the power supply 630, the function unit 640, and the display controller unit 650 may be mounted on the body 610. A display unit 660 may be disposed on a top surface of the body 610 or outside the body 610. For example, the display unit 660 may be disposed on a surface of the body 610 and display an image processed by the display controller unit 650. The power supply 630 may receive a predetermined voltage from an external power source, divide the predetermined voltage into various voltage levels, and transmit the divided voltages to the microprocessor unit 620, the function unit 640, and/or the display controller unit 650. The microprocessor unit 620 may receive a voltage from the power supply 630 and control the function unit 640 and the display unit 660. The function unit 640 may implement various functions of the electronic system 600. For instance, when the electronic system 600 is a mobile electronic product, such as a portable phone, the function unit 640 may include several elements capable of wireless communication functions, such as output of an image to the display unit 660 or output of a voice to a speaker, by dialing or communication with an external apparatus 670. When the function unit 640 includes a camera, the function unit 640 may serve as an image processor. In applied embodiments, when the electronic system 600 is connected to a memory card to increase capacity, the function unit 640 may be a memory card controller. The function unit 640 may exchange signals with the external apparatus 670 through a wired or wireless communication unit 680. In addition, when the electronic system 600 includes a universal serial bus (USB) to expand functions thereof, the function unit 640 may serve as an interface controller. The memory device 100*a* or 100*b* fabricated according to the embodiments of the inventive concept may be included in the function unit 640.

Figure 21:
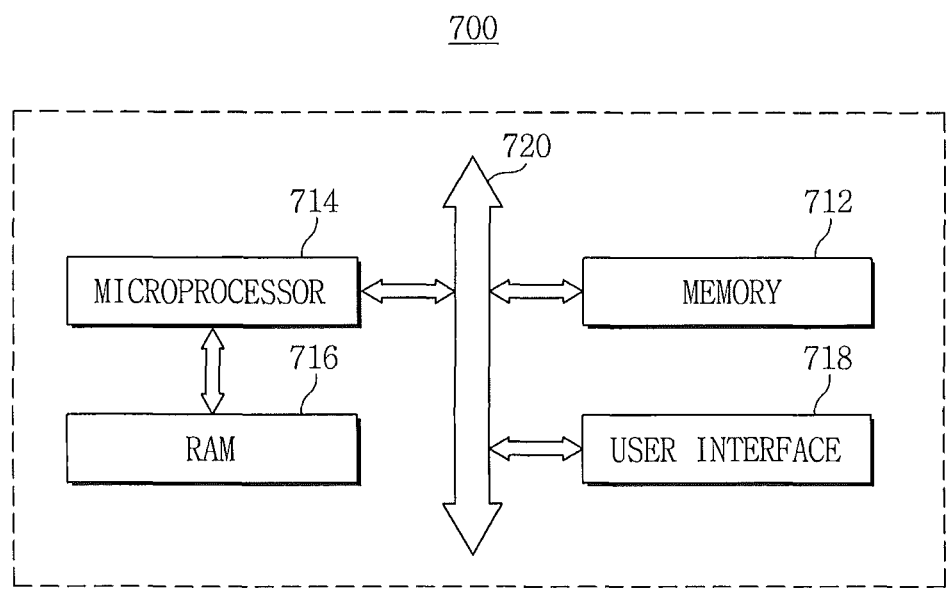
FIG. 21 is a schematic block diagram of an electronic system including a memory device according to embodiments of the inventive concept.

FIG. 21 is a schematic block diagram of an electronic system 700 including a memory device 100*a* or 100*b* fabricated according to embodiments of the inventive concept.

Referring to FIG. 21, the electronic system 700 may be applied to a mobile electronic device or a computer. For example, the electronic system 700 may include a memory system 712, a microprocessor 714, a random access memory (RAM) 716, and a user interface 718, which may communicate data using a bus 720. The microprocessor 714 may program and control the electronic system 700. The RAM 716 may be used as an operation memory of the microprocessor 714. For example, the microprocessor 714 or the RAM 716 may include one of the memory devices 100*a* and 100*b* according to embodiments of the inventive concept.

The microprocessor 714, the RAM 716, and/or other elements may be assembled within a single package. The user interface 718 may be used to input data to the electronic system 700 or output data from the electronic system 700. The memory system 712 may store codes for operating the microprocessor 714, data processed by the microprocessor 714, or external input data. The memory system 712 may include a controller and a memory.

Figure 22:
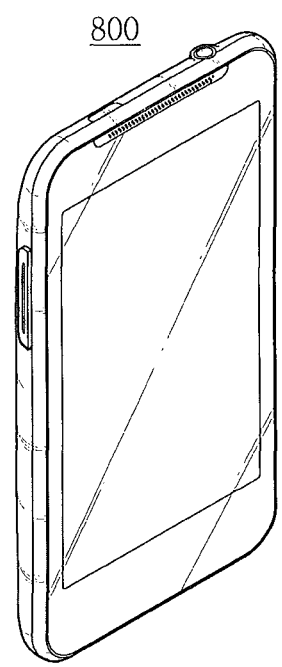
FIG. 22 is a schematic diagram of a mobile electronic device including a memory device according to embodiments of the inventive concept.

FIG. 22 is a schematic diagram of a mobile electronic device 800 including a memory device 100*a* or 100*b* fabricated according to embodiments of the inventive concept.

The mobile electronic device 800 may be, for example, a tablet personal computer (PC). Furthermore, at least one of memory devices 100*a* and 100*b* may be used not only for a tablet PC but also for a portable computer such as a laptop computer, an MPEG-1 audio layer 3 (MP3) player, an MP4 player, a navigation device, a solid-state disk (SSD), a desktop computer, or electronic devices for automotive and household uses.

In a method of fabricating a memory device according to various embodiments of the inventive concept, one impurity layer of a dummy diode formed in a dummy region can include a low-concentration of impurities. The impurity layer of the dummy diode having the low impurity concentration may be an n-type layer or a p-type layer, which may reduce leakage currents from the dummy diodes that might otherwise negatively impact operation of devices in the cell region CA.

Accordingly, when a memory device is fabricated using a method of fabricating a memory device according to the inventive concept, a dummy region of the memory device can be more electrically isolated from a cell region thereof. Therefore, the memory device can perform stable read/write operations.

The foregoing is illustrative of embodiments and is not to be construed as limiting thereof. Although a few embodiments have been described, those skilled in the art will readily appreciate that many modifications are possible without materially departing from the novel teachings and advantages. Accordingly, all such modifications are intended to be included within the scope of this inventive concept as defined in the claims. In the claims, means-plus-function clauses are intended to cover the structures described herein as performing the recited function, and not only structural equivalents but also equivalent structures.

What is claimed is:

1. A method of fabricating a memory device, comprising:
    defining a cell region on a substrate and defining a dummy region on the substrate that surrounds the cell region;
    forming bit lines on a top surface of the substrate, the bit lines extending in one direction;
    forming cell vertical structures on top surfaces of the bit lines corresponding to the cell region, each cell vertical structure including a cell diode and a variable resistive element;
    forming dummy vertical structures on top surfaces of the bit lines corresponding to the dummy region, each dummy vertical structure including a dummy diode and a variable resistive element; and
    forming word lines in contact with top surfaces of the cell vertical structures and dummy vertical structures, the word lines intersecting the bit lines at right angles,
    wherein the cell diode includes a first impurity pattern that includes first conductivity type impurities and a second impurity pattern that includes second conductivity type impurities that are of an opposite conductivity type from the first conductivity type impurities, the dummy diode includes a first impurity pattern having a first concentration of the first conductivity type impurities and a second impurity pattern that includes a second concentration of the second conductivity type impurities, the first concentration being less than the second concentration, and the variable resistive element includes a first electrode, a variable resistor, and a second electrode.

2. The method of claim 1, wherein forming the bit lines and the word lines comprises:
    forming cell bit lines throughout the cell region and the dummy region;
    forming dummy bit lines in the dummy region, the dummy bit lines being parallel to the cell bit lines;
    forming cell word lines throughout the cell region and the dummy region, the cell word lines intersecting the cell bit lines at right angles; and
    forming dummy word lines in the dummy region parallel to the cell word lines.

3. The method of claim 2, wherein forming the bit lines, the word lines, the cell vertical structures, and the dummy vertical structures comprises:
    sequentially forming a first metal layer, a first impurity layer, and a second impurity layer on the substrate;
    implanting second conductivity type impurities into the first impurity layer of the dummy region;
    sequentially forming a first electrode layer, a variable resistive layer, and a second electrode layer on a top surface of the second impurity layer;
    patterning the first electrode layer, the variable resistive layer, and the second electrode layer;
    forming the cell bit lines, the dummy bit lines, preliminary cell vertical structures, and preliminary dummy vertical structures, the cell bit lines and the dummy bit lines extending on the substrate in one direction, the preliminary cell vertical structures being stacked on top surfaces of the cell bit lines, and the preliminary dummy vertical structures being stacked on top surfaces of the dummy bit lines;
    forming a second metal layer on top surfaces of the preliminary cell vertical structures and preliminary dummy vertical structures;
    patterning the second metal layer, the preliminary cell vertical structures, and the preliminary dummy vertical structures; and
    forming the cell word lines and the dummy word lines, forming island-shaped cell vertical structures in the cell region, and forming island-shaped dummy vertical structures in the dummy region.

4. The method of claim 3, wherein implanting the second conductivity type impurities into the first impurity layer formed in the dummy region comprises:
    forming a first mask pattern on a top surface of the second impurity layer corresponding to the cell region; and
    implanting the second conductivity type impurities into the first impurity layer corresponding to the dummy region using the first mask pattern as an ion implantation stop layer to form a first lightly doped impurity layer containing a low concentration of first conductivity type impurities,
    wherein the first conductivity type impurities are n-type impurities, and the second conductivity type impurities are p-type impurities.

5. The method of claim 3, wherein forming the bit lines, the preliminary cell vertical structures, and the preliminary dummy vertical structures comprises:
    forming second mask patterns on a top surface of the second electrode layer, the second mask patterns parallel to one side of the substrate and spaced apart from one another; and
    etching the first metal layer, the first impurity layer, the second impurity layer, the first electrode layer, the variable resistive layer, and the second electrode layer using the second mask patterns as an etch mask to form the cell bit lines, the preliminary cell vertical structures on the top surfaces of the cell bit lines, the dummy bit lines, and the preliminary dummy vertical structures on the top surfaces of the dummy bit lines.

6. The method of claim 3, wherein forming the word lines, the cell vertical structures, and the dummy vertical structures comprises:
    forming third mask patterns over the second metal layer to extend in a direction intersecting the bit lines at right angles;
    patterning the preliminary cell vertical structures and the preliminary dummy vertical structures using the third mask patterns as an etch mask to form word lines at right angles to the bit lines, the word lines having intersection regions intersecting the bit lines in the cell region and the dummy region; and forming island-shaped cell vertical structures in the intersection regions of the cell region and forming dummy vertical structures in the intersection regions of the dummy region.

7. The method of claim 3, wherein the first metal layer includes any one of tungsten (W), aluminum (Al), titanium nitride (TiN), and tungsten nitride (WN).

8. The method of claim 3, wherein the first electrode layer and the second electrode layer includes platinum (Pt), ruthenium (Ru), ruthenium oxide (RuOx), iridium (Ir), iridium oxide (IrOx), titanium nitride (TiN), tungsten (W), tantalum (Ta), or tantalum nitride (TaN).

9. The method of claim 3, wherein an insulating layer includes hafnium oxide (HfOx), titanium oxide (TiOx), nickel oxide (NiOx), zirconium oxide (ZrOx), aluminum oxide (AlOx), silicon oxide (SiOx), niobium oxide (NbOx), or tungsten oxide (WOx).

10. The method of claim 1, the first impurity pattern of the cell diode includes a third concentration of the first conductivity type impurities, and wherein the third concentration exceeds the first concentration.

11. A method of fabricating a memory device, comprising:
defining a cell region in a substrate and defining a dummy region around the cell region;
forming a plurality of parallel, spaced-apart bit lines extending across the cell region and the dummy region;
forming preliminary vertical structures having the same shape as the bit lines on top surfaces of the bit lines, each preliminary vertical structure including a first preliminary impurity pattern, a second preliminary impurity pattern, and a preliminary variable resistive element;
implanting second conductivity type impurities into the first preliminary impurity patterns formed in the dummy region;
forming word lines at right angles to the bit lines, the word lines having intersection regions intersecting the bit lines in the cell region and the dummy region;
patterning the preliminary vertical structures to form island-shaped vertical structures in the respective intersection regions, each island-shaped vertical structure including a first impurity pattern, a second impurity pattern, and a variable resistive element; and
implanting second conductivity type impurities into first impurity patterns of the vertical structures disposed in the dummy region parallel to the word lines.

12. The method of claim 11, wherein forming the bit lines and the preliminary vertical structures comprises:
sequentially forming a first metal layer, a first impurity layer, a second impurity layer, a first electrode layer, a variable resistive layer, and a second electrode layer on the substrate;
forming first mask patterns over the second electrode layer, the first mask patterns spaced apart from one another and parallel to one another; and
performing a patterning process using the first mask patterns as an etch mask to form the preliminary vertical structures under the second mask patterns, each preliminary vertical structure including a bit line, a first preliminary impurity pattern, a second preliminary impurity pattern, a first preliminary electrode, a preliminary variable resistor, and a second preliminary electrode,
wherein the preliminary variable resistive element includes the first preliminary electrode, the preliminary variable resistor, and the second preliminary electrode.

13. The method of claim 12, wherein forming the preliminary vertical structure comprises forming the second electrode layer to a greater thickness than the first electrode layer.

14. The method of claim 11, wherein implanting the second conductivity type impurities into each of the first preliminary impurity pattern and the first impurity pattern comprises implanting the second conductivity type impurities into the first preliminary impurity pattern and the first impurity pattern at a predetermined implantation angle,
wherein the first preliminary impurity pattern and the first impurity pattern into which the second conductivity type impurities are implanted contain a low-concentration of n-type impurities, and the second conductivity type impurities are p-type impurities.

15. The method of claim 11, wherein the dummy region includes first regions disposed parallel to the bit lines and opposite one another and second regions disposed parallel to the word lines and opposite one another,
wherein one bit line is formed in each of the first regions, and one word line is formed in each of the second regions.

16. A method of forming a memory device, comprising:
forming a plurality of memory cells in a cell region of the memory device;
forming a plurality of dummy memory cells in a dummy region of the memory device;
forming a plurality of cell diodes that are electrically connected in series with respective ones of the memory cells;
forming a plurality of dummy diodes that are electrically connected in series with respective ones of the dummy memory cells,
wherein the cell diodes and the dummy diodes each include a first impurity pattern having impurities of a first conductivity type and a second impurity pattern having impurities of a second conductivity type that is opposite the first conductivity type, and wherein the second impurity pattern in the dummy diodes is more heavily doped than is the first impurity pattern in the dummy diodes.

17. The method of claim 16, wherein the first impurity pattern in the cell diodes is a heavily-doped impurity pattern and wherein the first impurity pattern in the dummy diodes is a lightly-doped impurity pattern.

18. The method of claim 16, wherein each memory cell includes a variable resistor, and wherein p-n junctions of the dummy diodes have a larger difference in impurity concentration than do p-n junctions of the cell diodes.

19. The method of claim 16, wherein forming the plurality of dummy diodes comprises forming the first impurity pattern having impurities of the first conductivity type and forming the second impurity pattern having impurities of the second conductivity type, and then implanting impurities of the second conductivity type into the first impurity pattern to reduce concentration of impurities of the first conductivity type in the first impurity pattern.

20. The method of claim 16, wherein the dummy region surrounds the cell region.

* * * * *